(12) United States Patent
Choi et al.

(10) Patent No.: US 10,658,289 B2
(45) Date of Patent: *May 19, 2020

(54) SEMICONDUCTOR DEVICES HAVING NONLINEAR BITLINE STRUCTURES

(71) Applicant: Samsung Electronics Co., Ltd., Suwon-si, Gyeonggi-do (KR)

(72) Inventors: Yunjung Choi, Seoul (KR); Kivin Im, Seongnam-si (KR); Dongbok Lee, Hwaseong-si (KR); Inseak Hwang, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/150,408

(22) Filed: Oct. 3, 2018

(65) Prior Publication Data
US 2019/0035724 A1    Jan. 31, 2019

Related U.S. Application Data

(60) Division of application No. 15/491,227, filed on Apr. 19, 2017, now Pat. No. 10,121,744, which is a
(Continued)

(30) Foreign Application Priority Data

May 21, 2014    (KR) .......................... 10-2014-0061163

(51) Int. Cl.
H01L 23/528    (2006.01)
H01L 27/115    (2017.01)
H01L 27/108    (2006.01)

(52) U.S. Cl.
CPC ...... H01L 23/528 (2013.01); H01L 27/10814 (2013.01); H01L 27/10823 (2013.01);
(Continued)

(58) Field of Classification Search
CPC ... H01L 23/528; H01L 27/108; H01L 27/115; H01L 27/10814; H01L 27/10823; H01L 27/10855; H01L 27/10885
See application file for complete search history.

(56) References Cited

U.S. PATENT DOCUMENTS 5,734,184 A    3/1998 Andoh et al.
6,172,898 B1    1/2001 Kajiyama
(Continued)

FOREIGN PATENT DOCUMENTS

JP          09-283718        10/1997
KR    10-2001-0059543 A     7/2001
(Continued)

Primary Examiner — David A Zarneke
(74) Attorney, Agent, or Firm — Muir Patent Law, PLLC

(57) ABSTRACT

Semiconductor devices are provided including a plurality of nonlinear bit lines formed on a substrate including a plurality of active areas; a plurality of word lines that pass through the plurality of active areas; an integral spacer that covers two sidewalls of the plurality of nonlinear bit lines and defines a plurality of spaces that expose two adjacent ones of the plurality of active areas; two conductive patterns that respectively abut on the two-adjacent active areas in one of the plurality of spaces that is selected; and a contact separating insulation layer that is formed between the two conductive patterns in the one selected space.

9 Claims, 65 Drawing Sheets

Related U.S. Application Data continuation of application No. 14/701,777, filed on May 1, 2015, now Pat. No. 9,768,115.

(52) U.S. Cl.
CPC .. *H01L 27/10855* (2013.01); *H01L 27/10885* (2013.01); *H01L 27/10891* (2013.01); *H01L 27/115* (2013.01); *H01L 2924/0002* (2013.01)

(56) References Cited

U.S. PATENT DOCUMENTS

| | | |
|---|---|---|
| 6,282,113 B1 | 8/2001 | DeBrosse |
| 6,310,399 B1 | 10/2001 | Feurie et al. |
| 6,781,181 B2 | 8/2004 | Heo et al. |
| 7,031,179 B2 | 4/2006 | Yon et al. |
| 7,259,464 B1 | 8/2007 | Batra |
| 7,767,521 B2 | 8/2010 | Baek |
| 8,394,680 B2 | 3/2013 | Lee |
| 9,768,115 B2 * | 9/2017 | Choi .................... H01L 23/528 |
| 10,121,744 B2 * | 11/2018 | Choi .................... H01L 23/528 |
| 2005/0218440 A1 | 10/2005 | Park |

FOREIGN PATENT DOCUMENTS

| | | |
|---|---|---|
| KR | 10-2006-0036650 A | 5/2006 |
| KR | 10-2006-0059037 A | 6/2006 |
| KR | 10-2011-0001703 A | 1/2011 |

* cited by examiner

X-X'

Y-Y'

X-X'

Y-Y'

X-X'

Y-Y'

X-X'

Y-Y'

X–X'

Y-Y'

X–X'

Y-Y'

X-X'

Y-Y'

X-X'

Y-Y'

X-X'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

X-X'

Y-Y'

X-X'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

Y-Y'

X-X'

Y-Y' und SEMICONDUCTOR DEVICES HAVING NONLINEAR BITLINE STRUCTURES

CROSS-REFERENCE TO RELATED APPLICATIONS

This application is a divisional of U.S. patent application Ser. No. 15/491,227, filed Apr. 19, 2017, which is a continuation of U.S. patent application Ser. No. 14/701,777, filed May 1, 2015 (now U.S. Pat. No. 9,768,115), which claims the benefit of Korean Patent Application No. 10-2014-0061163, filed May 21, 2014, the disclosures of which are hereby incorporated herein by reference in their entireties.

FIELD

The inventive concept relates to generally to semiconductor devices, and more particularly, to semiconductor devices including conductive patterns in a space defined by a bit line having a nonlinear shape and a spacer covering sidewalls of the bit line.

BACKGROUND

As the semiconductor device becomes more highly integrated, the design rule regarding components of the semiconductor device is decreasing. It is becoming increasingly difficult to form a plurality of wiring lines and contacts between the wiring lines in a highly integrated semiconductor without shorting things together. Accordingly, conventional methods where a contact connects an active area and a capacitor is formed thereon are not sufficient without any change.

SUMMARY

Some embodiments of the present inventive concept provide a semiconductor device wherein a contact that connects an active area and a capacitor is formed by self-alignment without an exposure process. It is becoming difficult to form a plurality of wiring lines and contacts interposed between the wiring lines in a highly scaled semiconductor which has a small cell size due to high integration.

Further embodiments of the inventive concept, the semiconductor device may include a plurality of nonlinear bit lines on a substrate including a plurality of active areas; a plurality of word lines that pass through the plurality of active areas; integral spacers that cover two sidewalls of the plurality of nonlinear bit lines and define a plurality of spaces that expose two adjacent ones of the plurality of active areas, respectively; two conductive patterns that respectively abut on the two adjacent active areas in a space that is selected from the plurality of spaces; and contact separating insulation layers that are formed between the two conductive patterns in the one selected space.

In still further embodiments, the plurality of nonlinear bit lines may include a first bit line portion that overlaps at least one of the plurality of active areas in parallel, and wherein a length of the first bit line portion is no less than a pitch of the plurality of word lines. The first bit line portion may overlap two adjacent ones of the plurality of word lines.

In some embodiments, the plurality of nonlinear bit lines may comprise a first bit line portion that overlaps at least one of the plurality of active areas in parallel, and wherein a length of the first bit line portion is equal to or greater than a distance between two adjacent ones of the plurality of word lines. The first bit line portion may not overlap the plurality of word lines.

In further embodiments, the plurality of nonlinear bit lines may include a first bit line portion that crosses and overlaps at least one of the plurality of active areas and a second bit line portion that does not overlap the plurality of active areas, and a length of the second bit line portion may be equal to or greater than a pitch of the plurality of word lines.

In still further embodiments, the semiconductor device may further include a direct contact that overlaps the first bit line portion and connects the plurality of nonlinear bit lines and the plurality of active areas.

In some embodiments, the second bit line portion may overlap two adjacent ones of the plurality of word-lines. The integral spacer and the contact separating insulation layer may include the same material. The integral spacer and the contact separating insulation layer may include different materials from each other.

In further embodiments, a distance between a bottom surface and an upper surface of each of the plurality of nonlinear bit lines may be smaller than a distance between a bottom surface and an upper surface of each of the integral spacers.

In still further embodiments, a distance between a bottom surface and an upper surface of the contact separating insulation layer may be greater than a distance between a bottom surface and an upper surface of the integral spacer.

In some embodiments, the semiconductor device may further include two landing pads respectively abutting on the two conductive patterns on the two conductive patterns.

Further embodiments of the present inventive concept, a semiconductor device is provided including a pair of nonlinear bit lines that are formed on a substrate including a plurality of active areas and that are symmetrically-shaped; a plurality of word lines that pass through the plurality of active areas; integral spacers that-cover sidewalls of the pair of the nonlinear bit lines in an area between the pair of the nonlinear bit lines and include a plurality of spaces that are arranged in a row; two conductive patterns that are formed in one that is selected from the plurality of spaces and are spaced apart from each other; and a contact separating insulation layer formed between the two conductive patterns in the one selected space.

In still further embodiments, the pair of the nonlinear bit lines may have at least one inflection point, and the at least one inflection point may be located at a portion where the pair of the nonlinear bit lines overlap the plurality of word lines.

In some embodiments, a distance between the pair of the nonlinear bit lines may be regularly varied in a length direction of the pair of the nonlinear bit lines. The contact separating insulation layer may overlap the plurality of word lines.

In further embodiments, a semiconductor device is provided including spacers that have a variable width along a length direction and comprise a plurality of spaces that are arranged in a row; a pair of nonlinear bit lines that abut on two sidewalls of the spacers; two conductive patterns that are formed in one that is selected from the plurality of spaces and are spaced apart from each other; and a contact separating insulation layer that is formed between the two conductive patterns in the one selected space.

In still further embodiments, the two sidewalls of the spacer may each include a convex sidewall portion and a concave sidewall portion, and the plurality of spaces may be formed at positions where the plurality of spaces are surrounded by the convex sidewall portion of the spacer. The pair of the nonlinear bit lines may be in a zigzag shape.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1A:
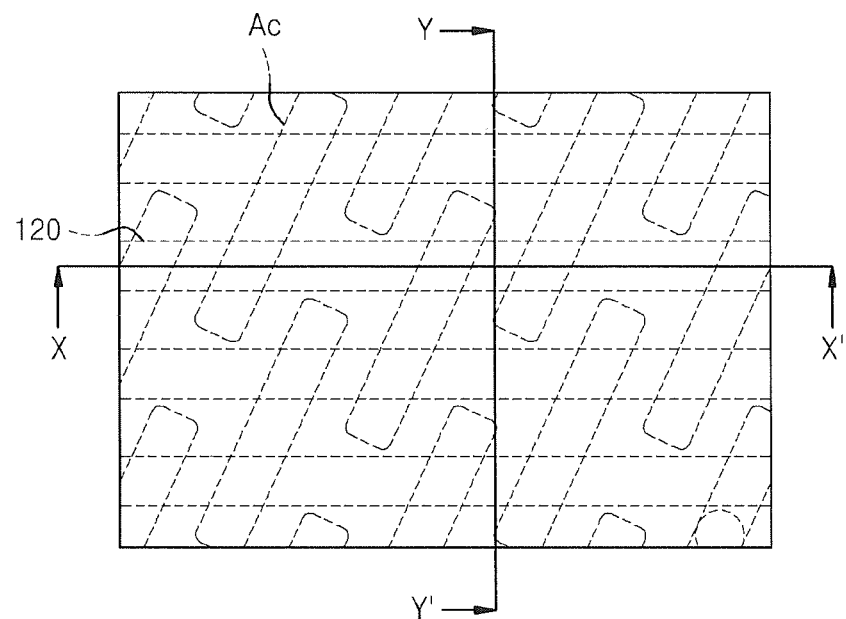
FIGS. 1A through 14C are diagrams illustrating processing steps in the fabrication semiconductor devices according to some embodiments of the inventive concept.

As used herein, the term "and/or" includes any and all combinations of one or more of the associated listed items. Expressions such as "at least one of," when preceding a list of elements, modify the entire list of elements and do not modify the individual elements of the list.

Hereinafter, the inventive concept will be described more fully with reference to the accompanying drawings, in which exemplary embodiments of the invention are shown. In the drawings, like elements are labeled like reference numerals and repeated description thereof will be omitted. This inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art.

In the present description, terms such as 'first', 'second', etc. are used to describe various members, areas, layers, regions, and/or components. However, it is obvious that the members, areas, layers, regions, and/or components should not be defined by these terms. The terms should not be construed as indicating any particular order, the upper or lower position, or superiority or inferiority, and are used only for distinguishing one member, area, layer, region, or component from another member, area, layer, region, or component. Thus, a first member, area, layer, region, or component which will be described may also refer to a second member, area, layer, region, or component, without departing from the teaching of the inventive concept. For example, without departing from the scope of the inventive concept, a first component may be referred to as a second component, and similarly, a second component may be referred to as a first component.

Unless defined differently, all terms used in the description including technical and scientific terms have the same meaning as generally understood by those skilled in the art. Terms that are commonly used and are as defined in a dictionary should be construed as having the same meaning as in an associated technical context, and unless defined apparently in the description, the terms are not ideally or excessively construed as having formal meaning.

When an embodiment is implementable in another manner, a predetermined process order may be different from a described one. For example, two processes that are consecutively described may be substantially simultaneously performed or may be performed in an opposite order to the described order.

In the drawings, for example, according to the manufacturing techniques and/or tolerances, shapes of the illustrated elements may be modified. Thus, the inventive concept should not be construed as being limited to the embodiments set forth herein, and should include, for example, variations in the shapes caused during manufacturing.

As used herein, the singular forms "a", "an" and "the" are intended to include the plural forms as well, unless the context clearly indicates otherwise.

FIGS. 1A through 14C are diagrams illustrating processing steps in the fabrication semiconductor devices according to some embodiments of the inventive concept. FIGS. 1A through 14A are plan views illustrating processing steps in the fabrication of semiconductor device 10 (FIGS. 14A through 14C). In order to clearly illustrate the relative position relationships in the plan views, an active area Ac, word lines 120, and a direct contact DC are illustrated by a dotted line. FIGS. 1B through 14B are cross sections corresponding to cross-sections of FIGS. 1A through 14A along the line X-X'. FIGS. 1C through 14C are cross sections corresponding to cross-sections of FIGS. 1A through 14A along a line Y-Y'.

Figure 1B:
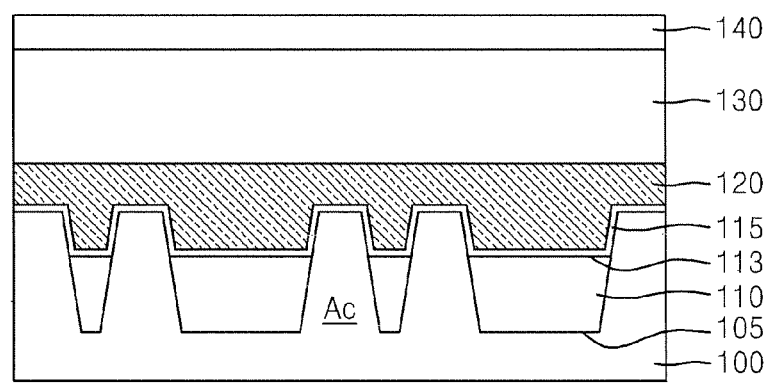
Figure 1C:
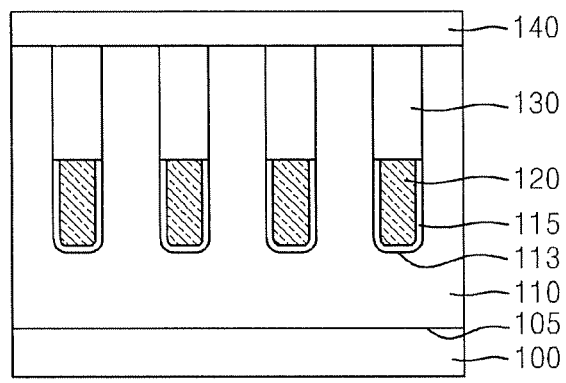

Referring first to FIGS. 1A through 1C, a device isolation trench 105 is formed in a substrate 100, and a device isolation layer 110 is formed in the device isolation trench 105. A plurality of active areas Ac is defined in the substrate 100 by the device isolation device 110. In some embodiments, the plurality of active areas Ac may each have an island shape that is relatively long and having a short axis and a long axis.

In some embodiments, the device isolation layer 110 may include, for example, a first insulation layer and a second insulation layer. The first and second isolation layers may be formed of different materials. For example, the first insulation layer may include an oxide layer, and the second isolation layer may include a nitride layer. However, it will be understood that embodiments of the present inventive concept are not limited to this configuration, thus, the composition of the device isolation layer 110 discussed herein are provide for example purposes only. For example, the device isolation layer 110 may be formed of a single layer formed of one type of insulation layer or a multilayer formed of a combination of at least three types of insulation layers without departing from the scope of the present inventive concept.

A plurality of word line trenches 113 are formed in the substrate 100. The plurality of word line trenches 113 extend substantially parallel to one another and each have a line shape that crosses the plurality of active areas Ac. The substrate 100 may include, for example, silicon (Si), such as crystalline Si, polycrystalline Si, or amorphous Si. In some embodiments, the substrate 100 may include germanium (Ge) or a compound semiconductor such as SiGe, silicon carbide (SiC), gallium arsenide (GaAS), indium arsenide (InAs), or indium phosphide (InP). In some embodiments, the substrate 100 may include a conductive area such as a well that is doped with an impurity or an impurity-doped structure.

As illustrated in FIG. 1B, in order to form a plurality of word line trenches 113, on a lower surface of which a step is formed, the device isolation layer 110 and the substrate 100 may be etched using a different, additional etching processes so that an etching depth of the device isolation layer 110 and an etching depth of the substrate 100 are different.

After cleaning a resultant product in which the plurality of word line trenches 113 are formed, a plurality of gate dielectric-layers 115, a plurality of word lines 120, and a plurality of buried insulation layers 130 are sequentially formed in the plurality of word line trenches 113.

In some embodiments, after forming the word lines 120, an impurity ion may be injected into the substrate 100 through two sides of the word lines 120 so as to form a source and drain area on an upper surface of the plurality of active areas Ac. In some embodiments, an impurity ion injection process for forming a source and drain area may be performed before forming the plurality of word lines 120.

An upper surface of each of the plurality of word lines 120 may be at a lower level than an upper surface of the substrate 100. A lower surface of the plurality of word lines 120 have an uneven shape, and a saddle fin-shaped field effect transistor (FINFET) is formed in the plurality of active areas Ac. In some embodiments, the plurality of word lines 120 are formed of at least one material selected from Titanium (Ti), Titanium Nitride (TiN), Tantalum (Ta), Tantalum Nitride (TaN), Tungsten (W), Tungsten Nitride (WN), Titanium Silicon Nitride (TiSiN), and Tungsten Silicon Nitride (WSiN).

The gate dielectric layer 115 may be formed of at least one selected from a silicon oxide layer, a silicon nitride layer, a silicon oxynitride layer, an oxide/nitride/oxide (ONO) layer, and a high-k dielectric film having a higher dielectric constant than a silicon oxide layer. For example, the gate dielectric layer 115 may have a dielectric constant of about 10 to about 25. In some embodiments, the gate dielectric layer 115 may be formed of at least one material selected from a hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 115 may be formed of $HfO_2$, $Al_2O_3$, $HfAlO_3$, $Ta_2O_3$, or $TiO_2$.

An upper surface of the buried insulation layer 130 may be at approximately the same level as the upper surface of the substrate 100. The buried insulation layer 130 may be formed of a silicon oxide layer, a silicon nitride layer, a silicon oxynitride layer, or any combination of these.

An insulation layer 140 is formed on the substrate 100. The insulation layer 140 may have a thickness of about 200 Å to about 400 Å. The insulation layer 140 may include a silicon oxide. For example, the insulation layer 140 may be formed of tetraethylorthosilicate (TEOS), high density plasma (HDP), or boro-phospho silicate glass (BPSG).

Meanwhile, the word lines 120 may be buried in the substrate 100 of the semiconductor device and may be arranged across the active areas Ac. As illustrated in FIG. 1A, two word lines 120 are arranged across one active area Ac, and as the active areas Ac are diagonally arranged, the active areas Ac may cross the word lines 120 at a predetermined angle that is less than 90°.

Figure 2A:
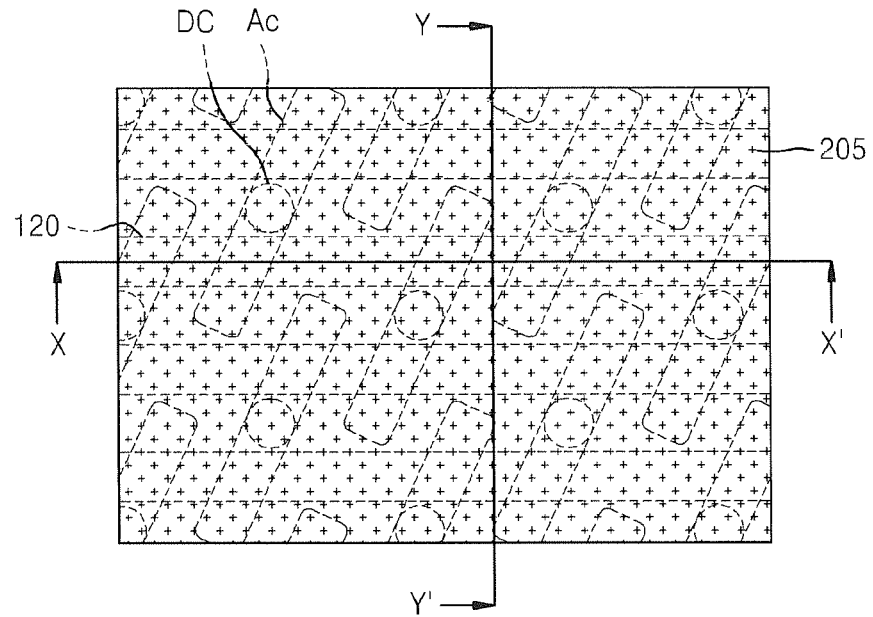
Figure 2B:
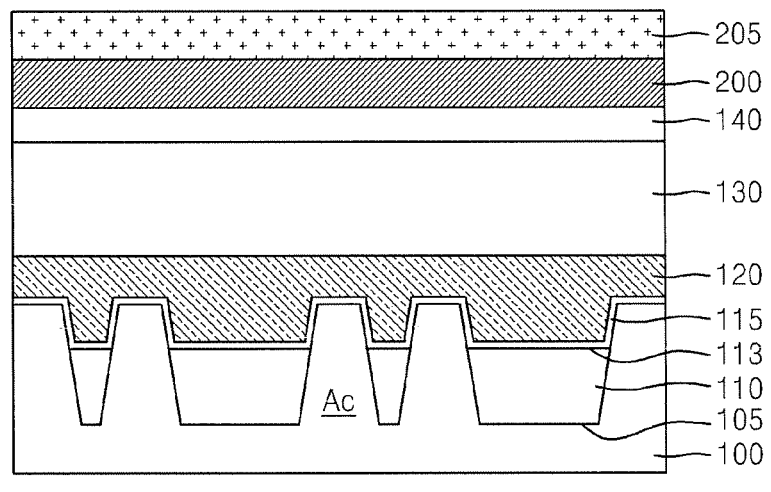
Figure 2C:
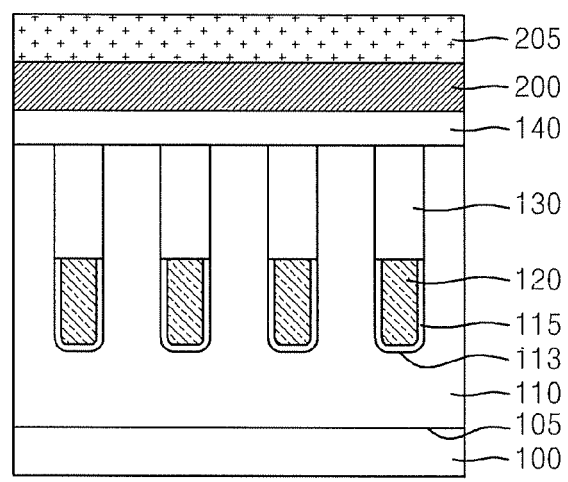

Referring now to FIGS. 2A through 2C, a bit line forming layer 200 and a plurality of direct contacts DC are formed on the insulation layer 140. An insulation capping layer 205 that covers an upper surface of the bit line forming layer 200 is formed.

In some embodiments, the bit line forming layer 200 may include at least one material selected from a semiconductor doped with an impurity, a metal, a conductive metal nitride, and a metal silicide. In some other embodiments, the bit line forming layer 200 may have a multilayer structure in which a first metal silicide layer, a conductive barrier layer, a second metal silicide layer, and an electrode layer formed of a metal or a metal nitride are sequentially stacked. For example, the bit line forming layer 200 may have a stacked structure in which doped polysilicon, TiN, and tungsten are sequentially stacked.

In some embodiments, the insulation capping layer 205 is formed of a silicon nitride layer. A thickness of the insulation capping layer 205 may be greater than that of the bit line forming layer 200.

Figure 3A:
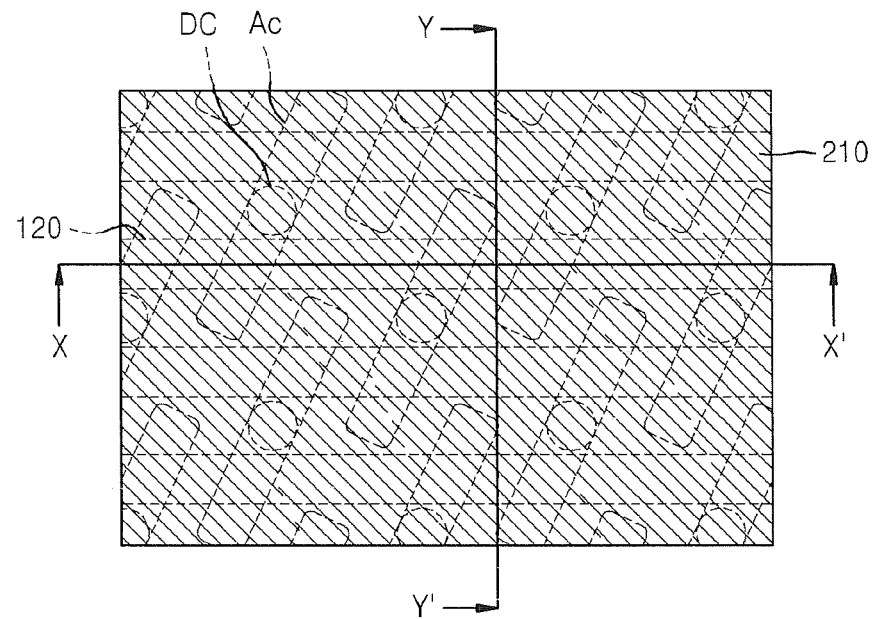
Figure 3B:
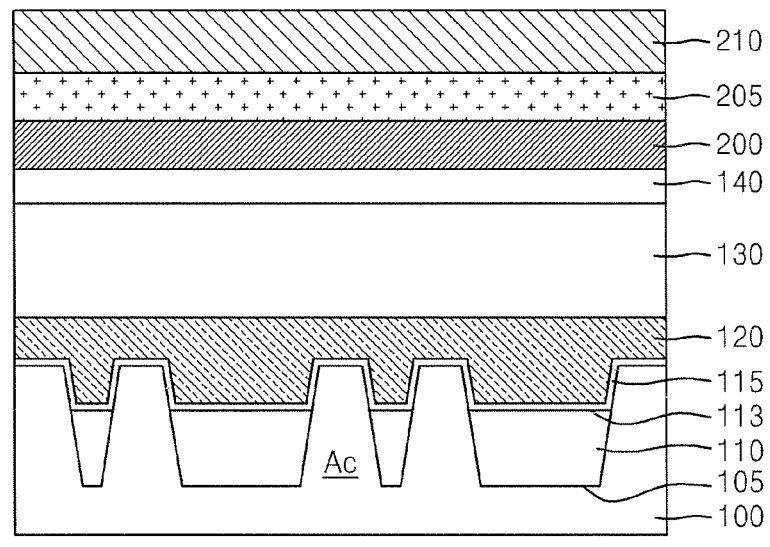
Figure 3C:
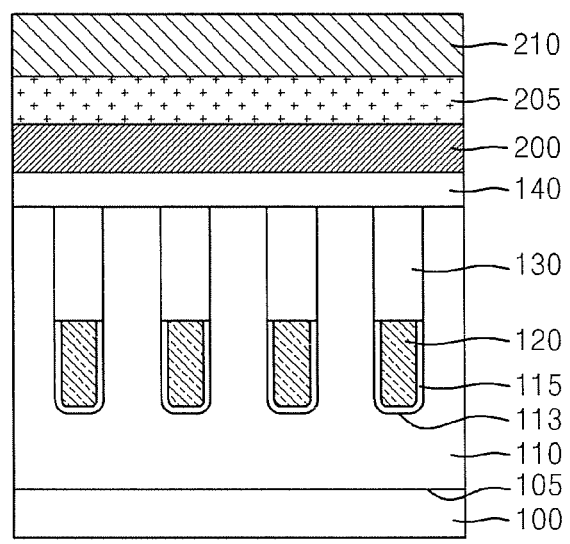

As illustrated in FIGS. 3A through 3C, a hard mask 210 for patterning a bit line is deposited on the insulation capping layer 205.

Figure 4A:
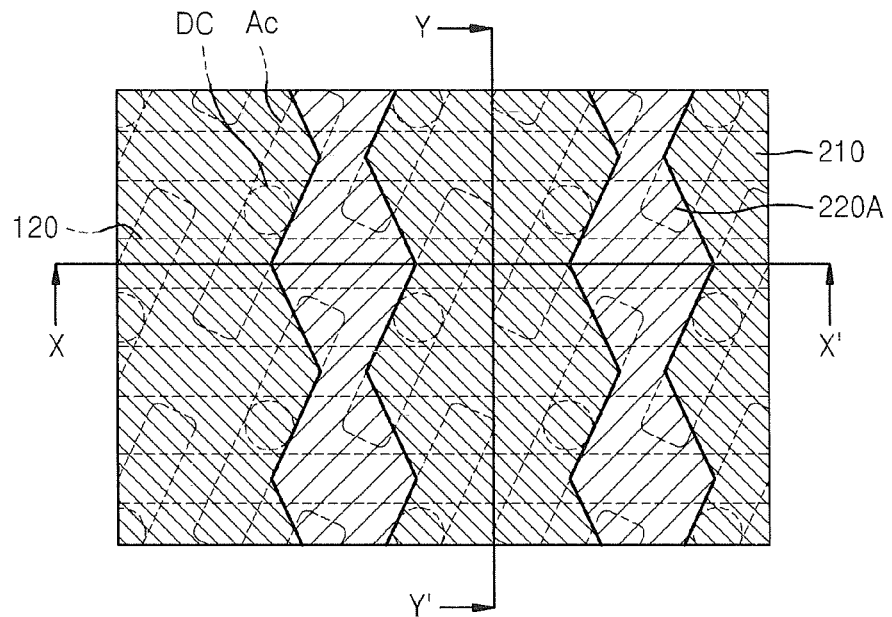
Figure 4B:
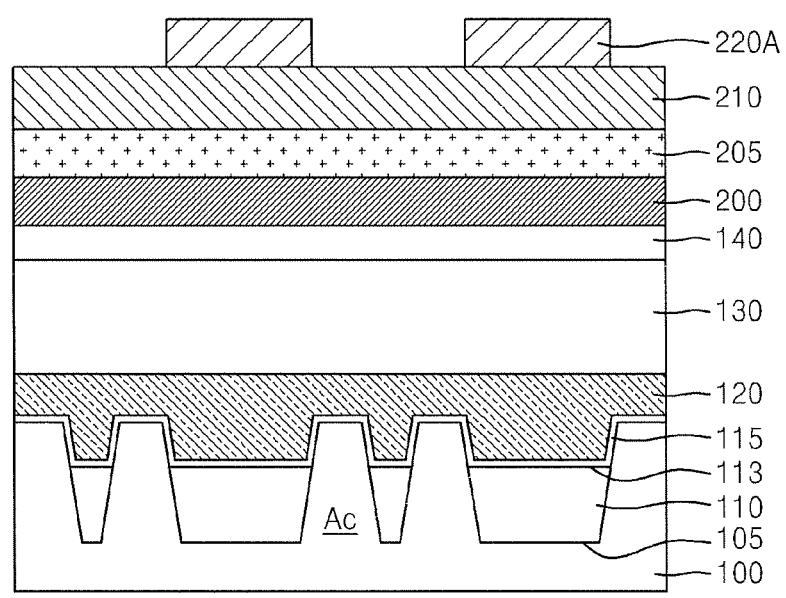
Figure 4C:
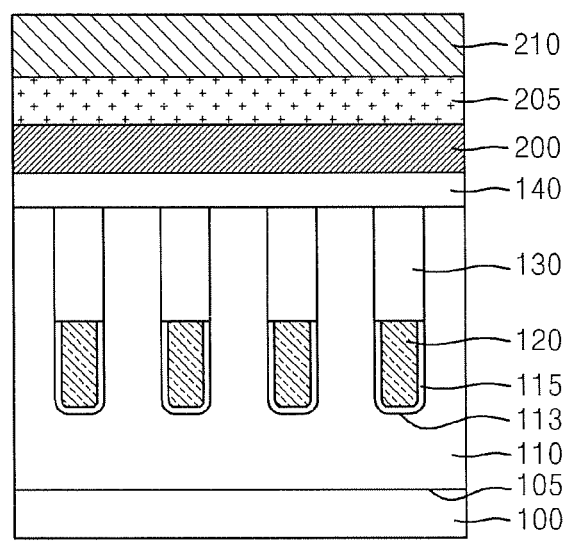

Referring now to FIGS. 4A through 4C, a photosensitive layer is deposited on the hard mask 210 for patterning a bit line. A plurality of photosensitive layer patterns 220A that have a variable width and a symmetrical shape are spaced apart from one another using exposure and development operations. In a subsequent operation, a sidewall profile of a bit line 200A (FIG. 8A) may be determined by a sidewall profile of the photosensitive layer patterns 220A.

Figure 5A:
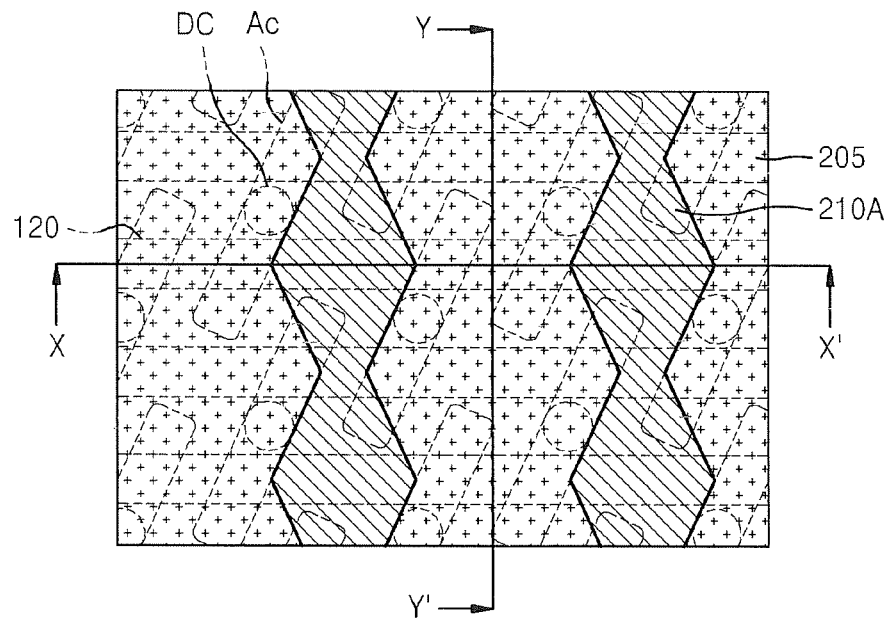
Figure 5B:
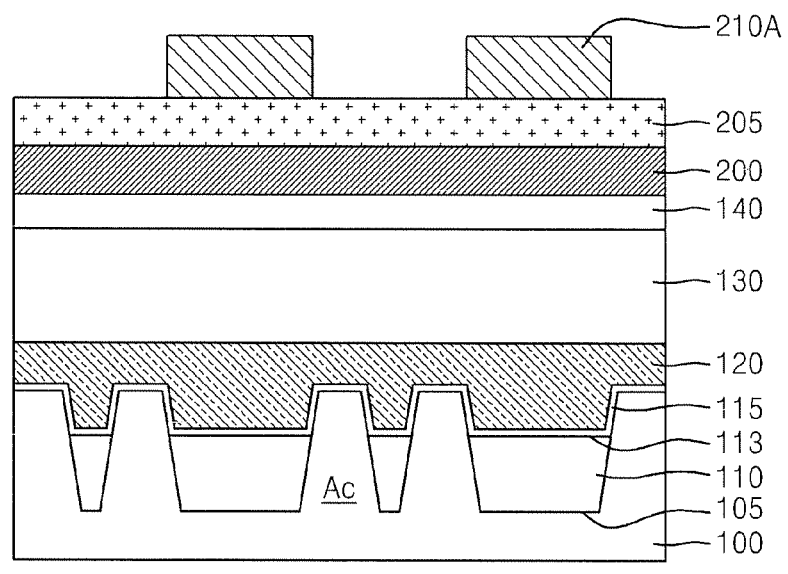
Figure 5C:
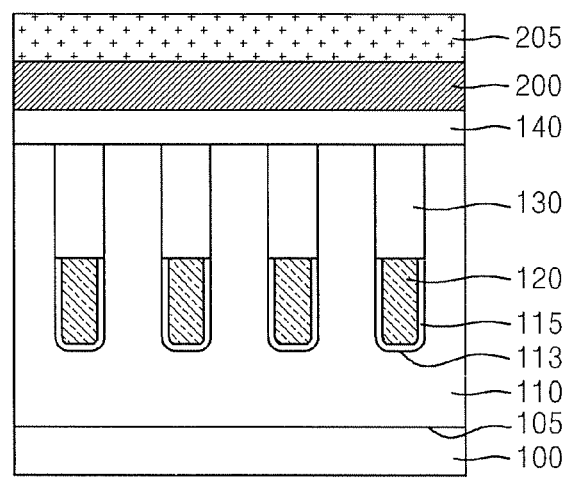

Referring now to FIGS. 5A through 5C, the photosensitive layer patterns 220A are used as an etching mask to perform a dry etching operation, thereby forming a hard mask pattern 210A.

Figure 6A:
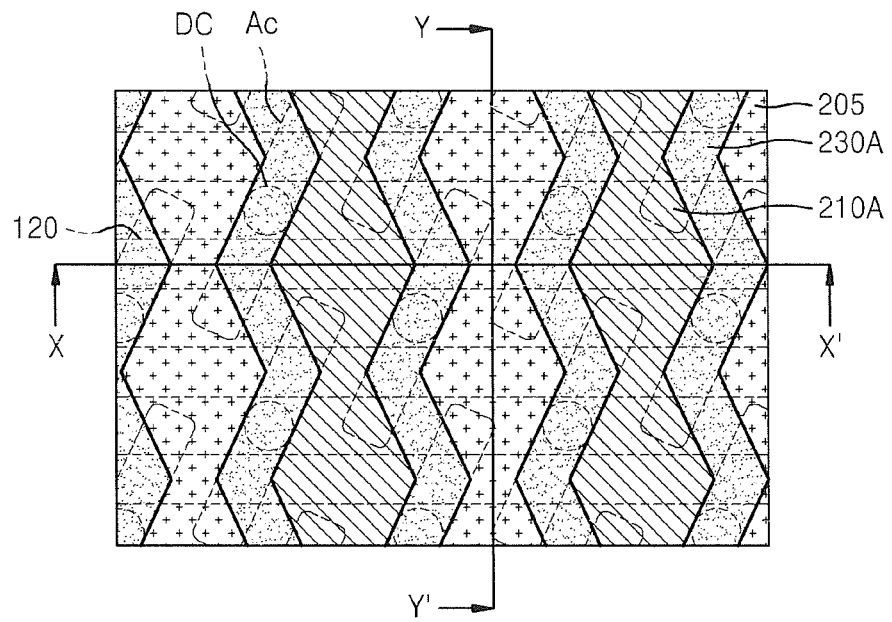
Figure 6B:
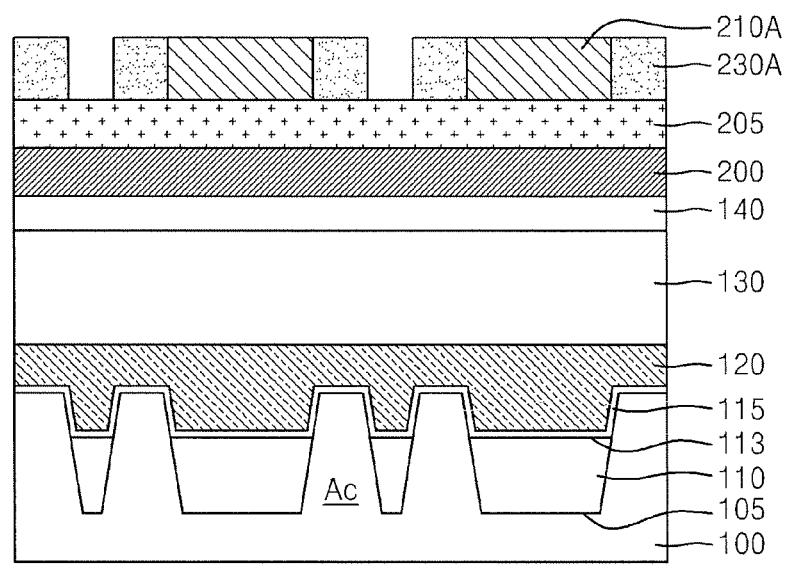
Figure 6C:
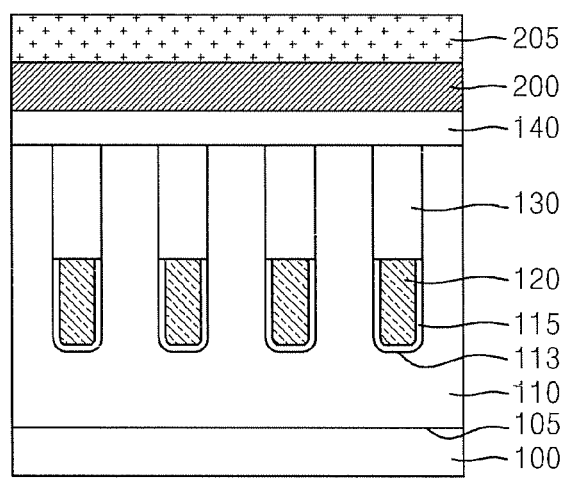
Figure 8A:
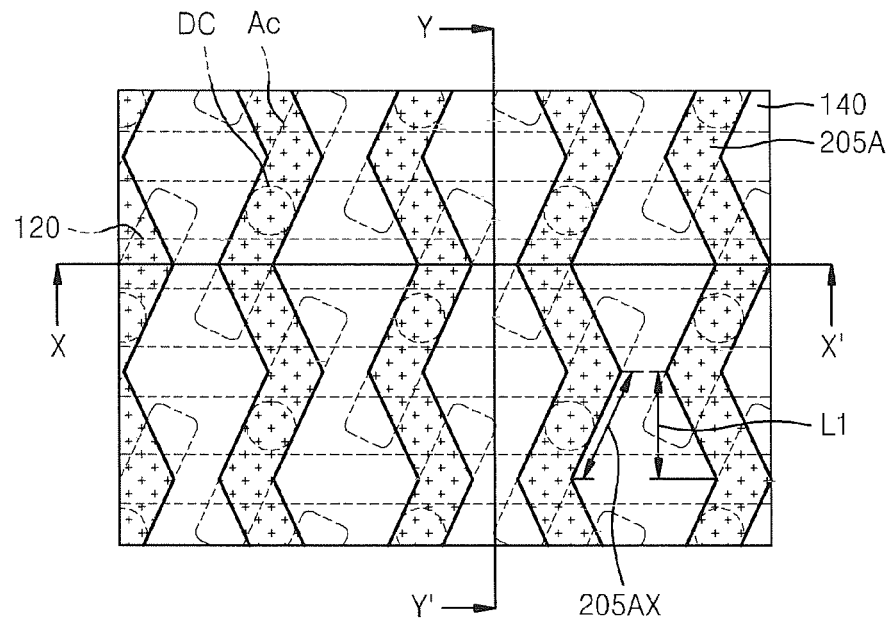
Figure 8B:
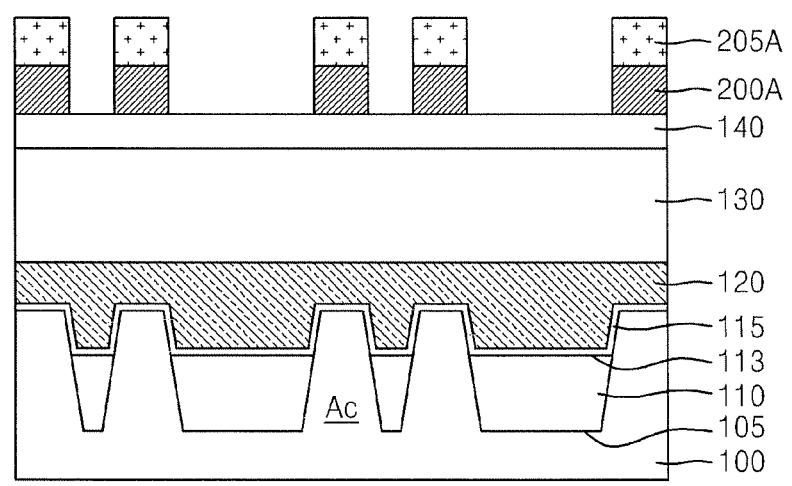

Referring now to FIGS. 6A through 6C, a spacer 230A for forming a bit line is formed on two sidewalls of the hard mask pattern 210A. To form the spacer 230A, an insulation layer that fills space between the hard mask patterns 210A is formed and the insulation layer is etched by using an etchback operation to expose an upper surface of the hard mask pattern 210A, and the spacer 230A for forming a bit line may be left on the two sidewalls of the hard mask pattern 210A. The spacer 230A transfers the shapes of the bit line 200A and an insulation capping line 205a (FIGS. 8A and 8B).

Figure 7A:
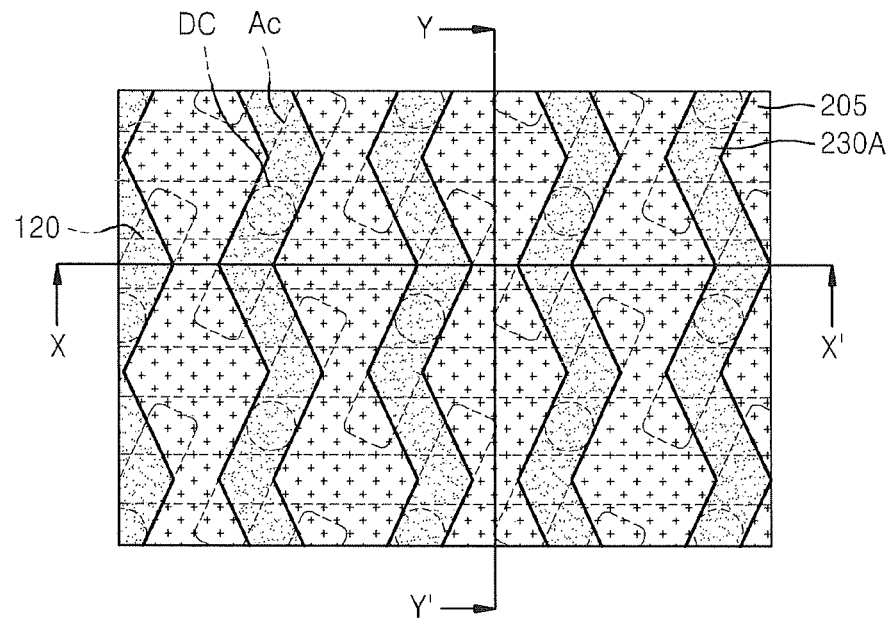
Figure 7B:
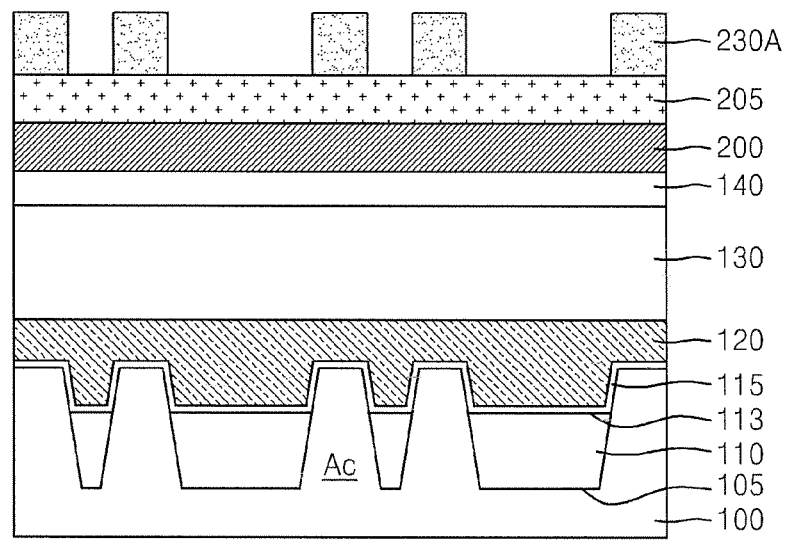
Figure 7C:
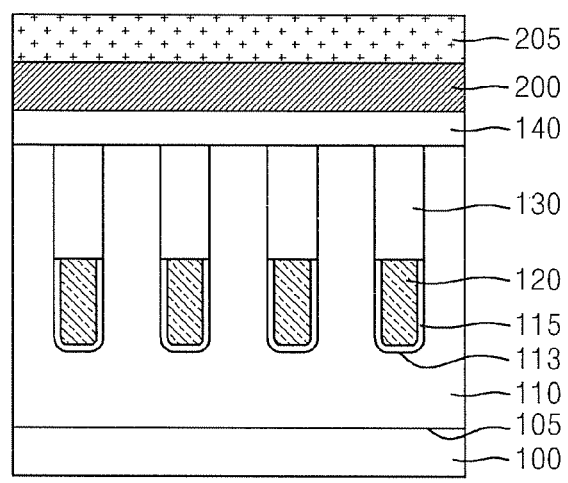
Figure 8C:
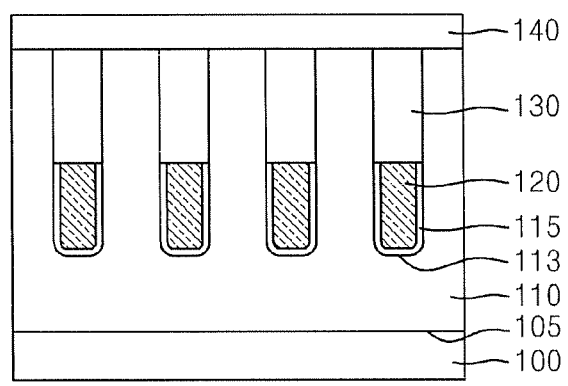

As illustrated in FIGS. 7A through 7C, the hard mask pattern 210A is removed to expose the spacer 230A for forming a bit line. Referring now to FIGS. 8A through 8C, the spacer 230A for forming a bit line is used as an etching mask to etch the bit line forming layer 200 and the insulation capping layer 205, thereby forming a bit-line 200A and an insulation capping line 205A, to which the shape of the spacer 230A for forming a bit line is transferred. The spacer 230A is removed. The bit line 200A may include a first bit line portion 205AX that overlaps at least one of the plurality of active areas Ac in parallel and a length of the first bit line portion 205AX may be equal to or greater than a pitch L1 of the plurality of word lines 120. The first bit line portion 205AX may be formed to overlap two adjacent ones of the plurality of word lines 120. The bit line 200A is nonlinear and may be, for example, a zigzag shape, a wavy shape, or a meandering shape.

Figure 9A:
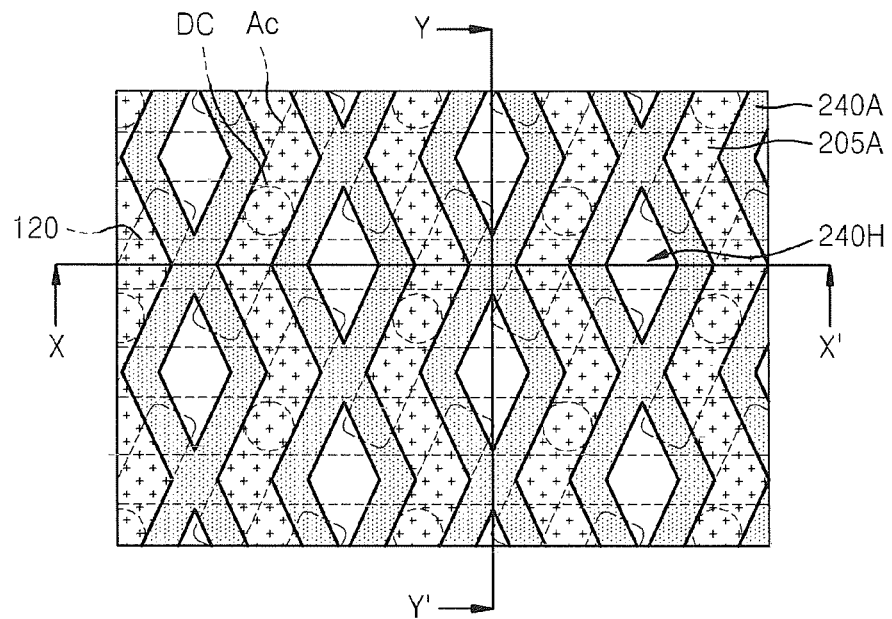
Figure 9B:
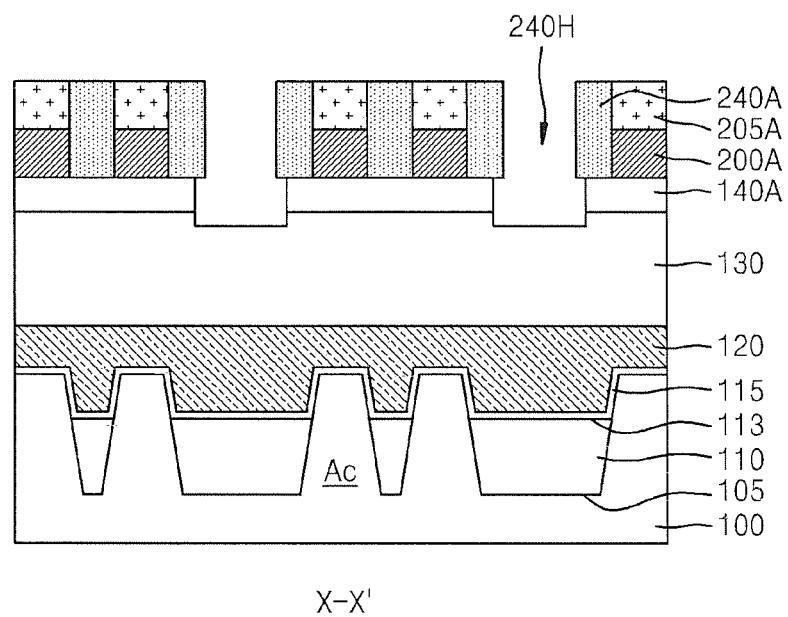
Figure 9C:
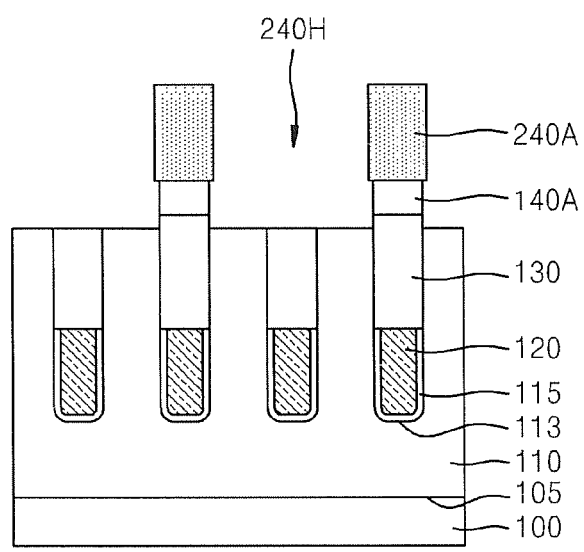

Referring now to FIGS. 9A through 9C, an integral spacer 240A having a plurality of spaces 240H is formed on two sidewalls of the bit line 200A and the insulation capping line 205A. To form the integral spacer 240A, an insulation layer that fills space between the bit lines 200A and space between the insulation capping lines 205A is formed in the space, and then the insulation layer is etched by using an etchback operation to expose an upper surface of the insulation capping lines 205A, and the integral spacer 240A may be left on the two sidewalls of the bit line forming layer 200A and the insulation capping line 205A. When performing the etchback operation to form the integral spacer 240A, portions of the insulation layer pattern 140 and the buried insulation layer 130 are etched. A wet etching operation may be performed to etch an insulation layer pattern 140A so that a portion of a bottom surface of the integral spacer 240A is exposed and forms an undercut area.

The integral spacer 240A has a variable width in that a wide width portion and a narrow width portion are alternately repeated, and a plurality of spaces 240H are formed in the wide width portion. The plurality of spaces 240H may be arranged in a row. The integral spacer 240A that is formed internally with respect to a pair of adjacent bit lines may be formed as a single unit so that the plurality of spaces 240H are formed, and the plurality of spaces 240H may expose two adjacent active areas Ac1 and Ac2 (see FIG. 12A) from among the plurality of active areas Ac. Thus, the plurality of spaces 240H, in which a conductive pattern 250 which is for forming a buried contact (see FIG. 10A) and abuts on the two active areas may be formed without an exposure operation, may be provided.

Figure 10A:
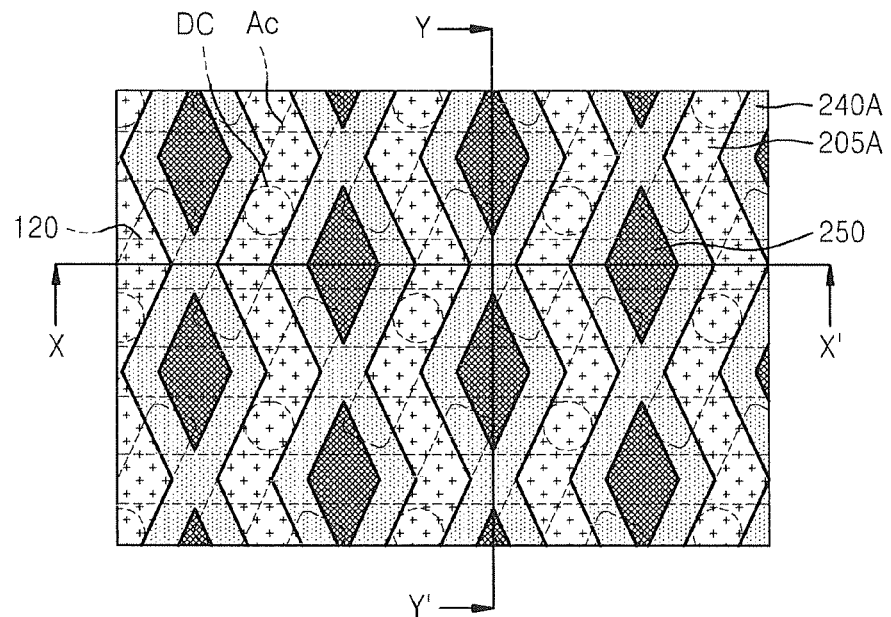
Figure 10B:
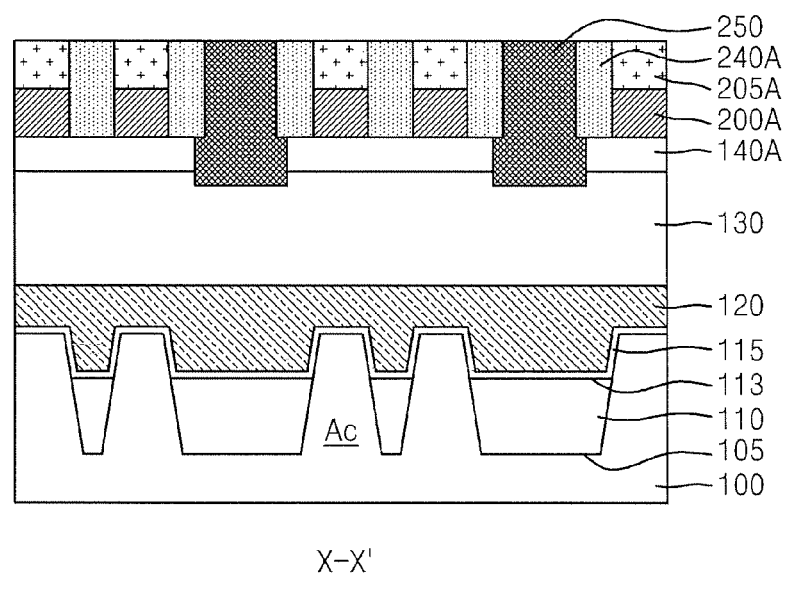
Figure 10C:
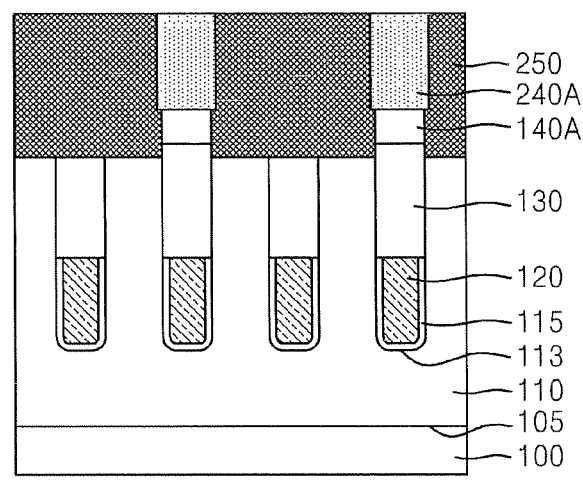

Referring now to FIGS. 10A through 10C, a conductive pattern 250 for forming a buried contact is formed in the plurality of spaces 240H in the integral spacer 240A. To form the conductive pattern 250 for forming a buried contact, first, a conductive layer that fills the plurality of spaces 240H between the integral spacers 240A is formed, and the conductive layer is etched by using an etchback operation or a chemical mechanical polishing (CMP) operation to expose upper surfaces of the insulation capping lines 205A and the integral spacers 240A, and the conductive pattern 250 for forming a buried-contact may be left in the plurality of spaces 240H.

In some embodiments, the conductive pattern 250 for forming a buried contact may be formed of polysilicon. The polysilicon may be doped with an impurity. The conductive pattern 250 for forming a buried contact may be formed of a metal, a metal silicide, a metal nitride, or a combination of these. The conductive pattern 250 for forming a buried contact may include a barrier layer that covers an inner wall of the plurality of spaces 240H and a conductive layer that fills an inner portion of the barrier layer. In some embodiments, the barrier layer may have a Ti—TiN stack structure.

When the conductive pattern 250 for forming a buried contact is formed of a metal, a metal silicide layer may be formed between the conductive pattern 250 for forming a buried contact and the active area Ac. For example, the metal silicide layer may be a cobalt (Co) silicide layer. However, it will be understood that embodiments of the present inventive concept are not limited to this configuration. For example, the metal silicide layer may be formed of various types of metal silicides without departing from the scope of the present inventive concept.

Figure 11A:
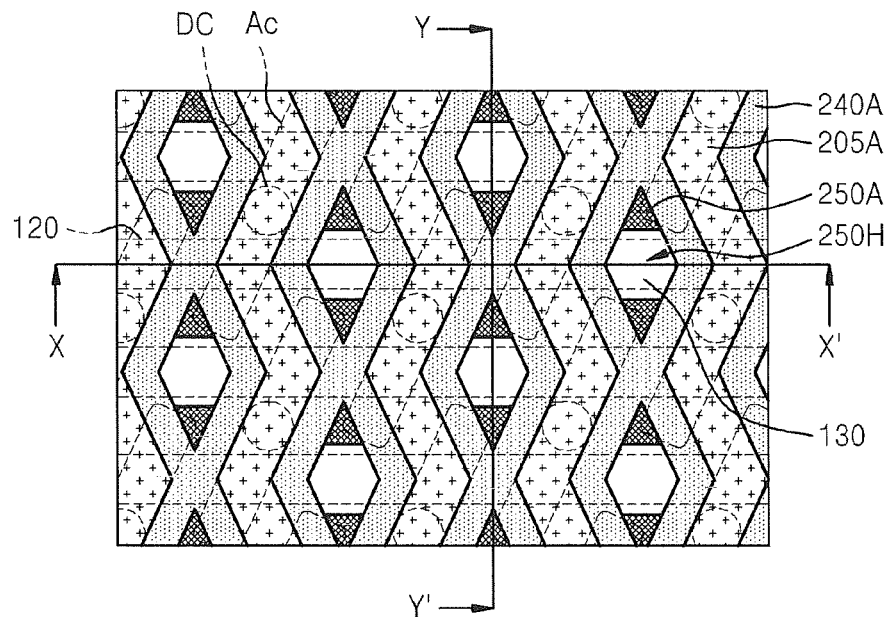
Figure 11B:
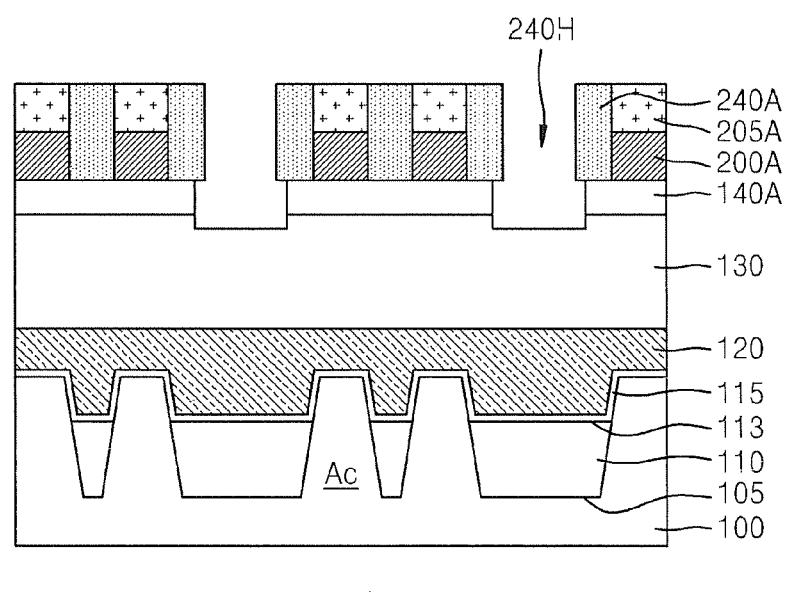
Figure 11C:
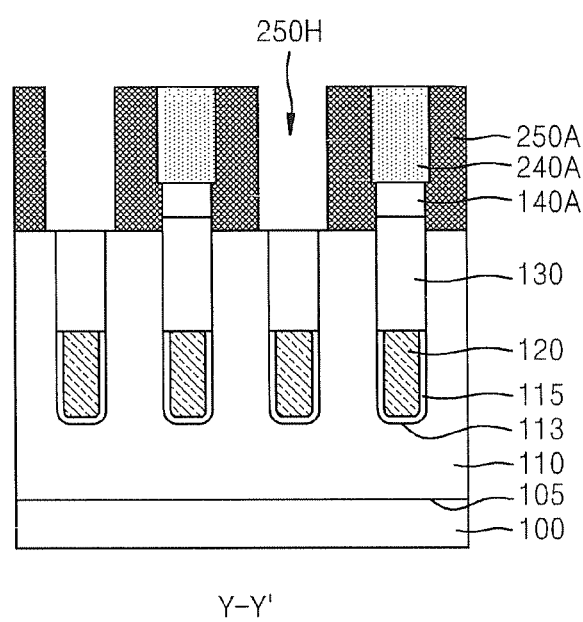

Referring to FIGS. 11A through 11C, an etching operation is performed to divide the conductive pattern 250 for forming a buried contact, which is formed in the plurality of spaces 240H (see FIG. 10A), into two spaces, thereby forming space 250H in which a contact separating insulation layer 260A is to be formed. A seam indicating an empty central portion of the conductive pattern 250 for forming a buried contact may be formed in the conductive pattern 250. However, the seam is removed by using the etching operation, and thus, deterioration of electrical properties of the semiconductor device due to the seam may be prevented.

Figure 12A:
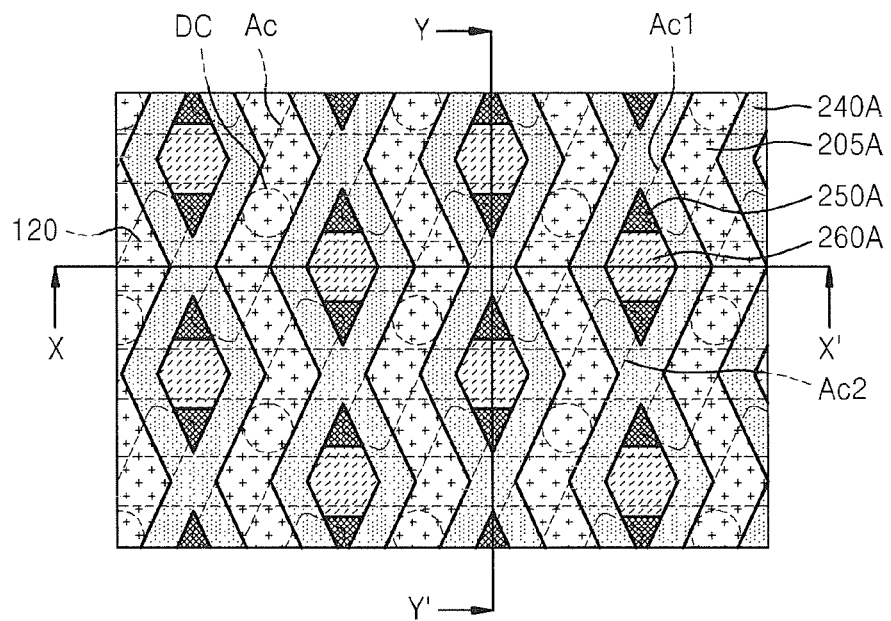
Figure 12B:
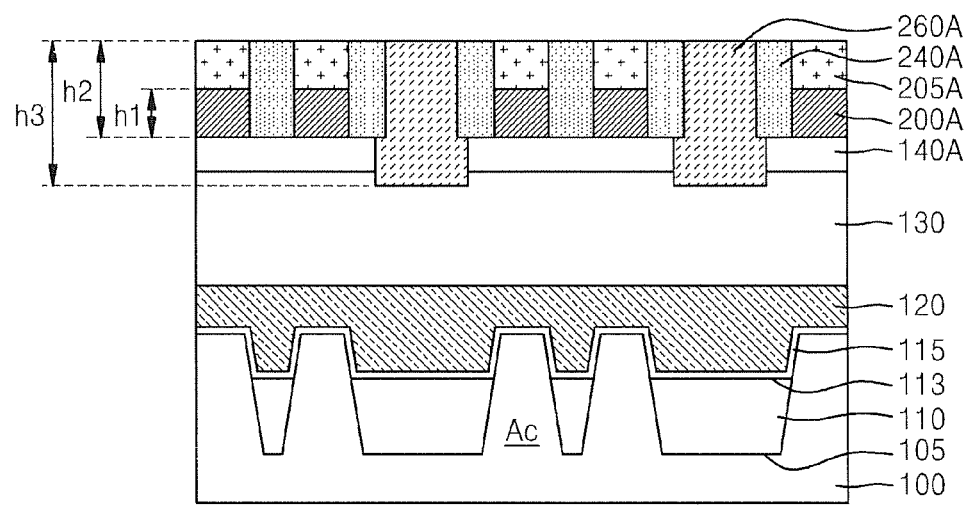
Figure 12C:
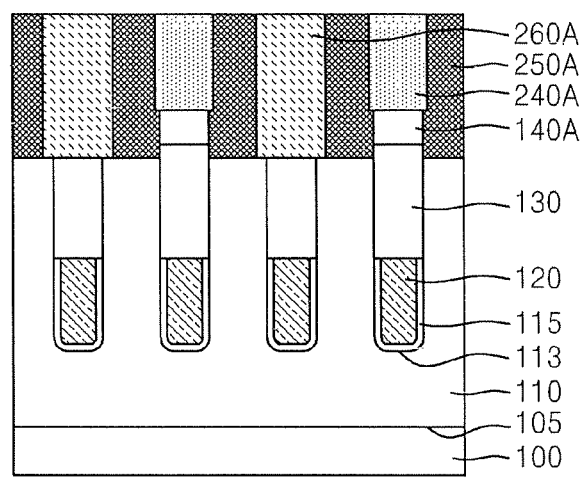

Referring now to FIGS. 12A through 12C, a contact separating insulation layer 260A is filled in the space 250H (see FIGS. 11A through 11C), in which the contact separating insulation layer 260A is to be formed. After forming an insulation layer that fills the space 250H in which the contact separating insulation layer 260A is to be formed, the insulation layer is etched using an etchback operation or a CMP operation to expose an upper surface of a buried contact 250A, and the contact separating insulation layer 260A may be left in the space 250H. The contact separating insulation layer 260A may be formed at a position where it is overlapped with the plurality of word lines 120.

A distance h1 between a bottom surface and an upper surface of the bit line 200A may be smaller than a distance h2 between a bottom surface and an upper surface of the integral spacer 240A. A distance h3 between a bottom surface and an upper surface of the contact separating insulation layer 260A may be greater than the distance h2 between the bottom surface and the upper surface of the integral spacer 240A.

Through the above operation, two conductive patterns respectively abutting on the two active areas Ac1 and Ac2, that is, the buried contacts 250A, may be formed in the space 250H (see FIGS. 11A through 11C) formed in the spacer 240A. FIG. 12A schematically illustrates two adjacent active areas Ac1 and Ac2 in one of the plurality of spaces 250H that is selected, in which a plurality of contact separating insulation layers are to be formed in the integral spacer 240A, and two buried contacts 250A that respectively contact the two adjacent active areas Ac1 and Ac2.

Figure 13A:
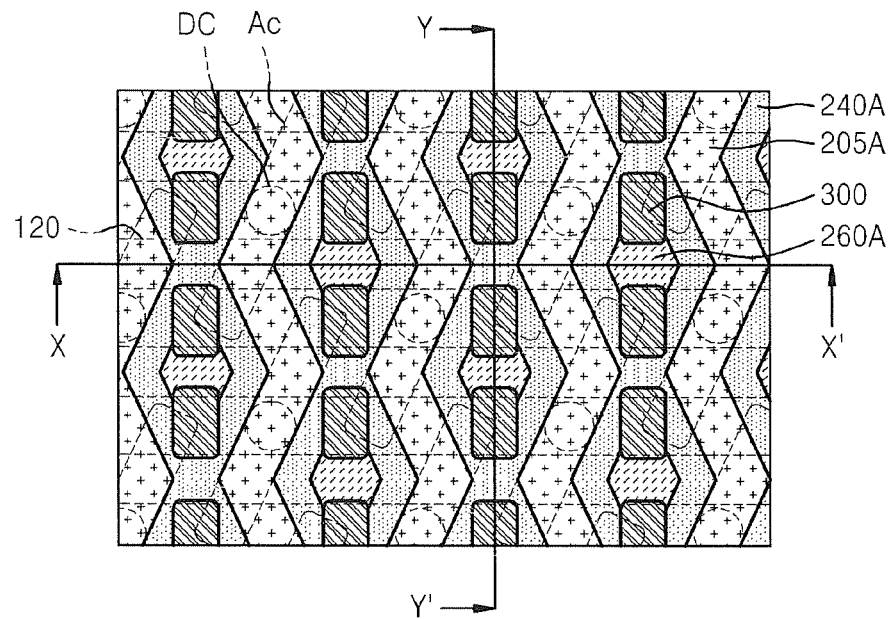
Figure 13B:
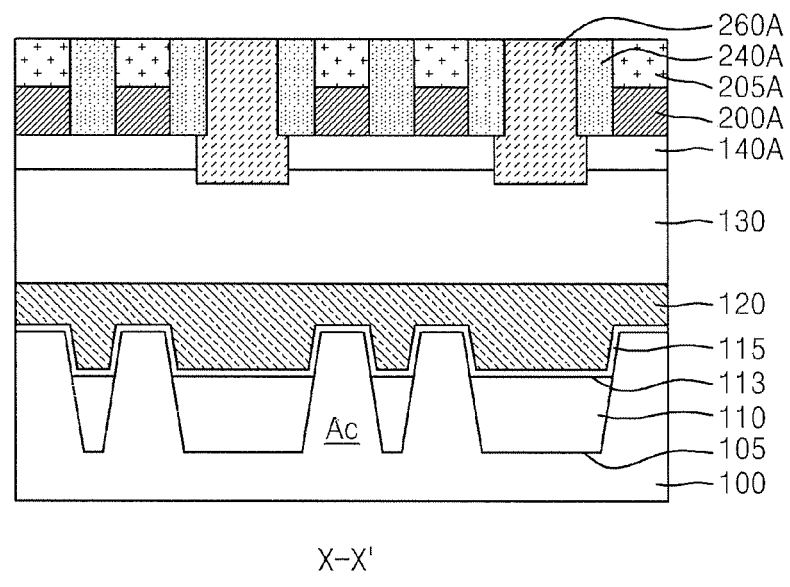
Figure 13C:
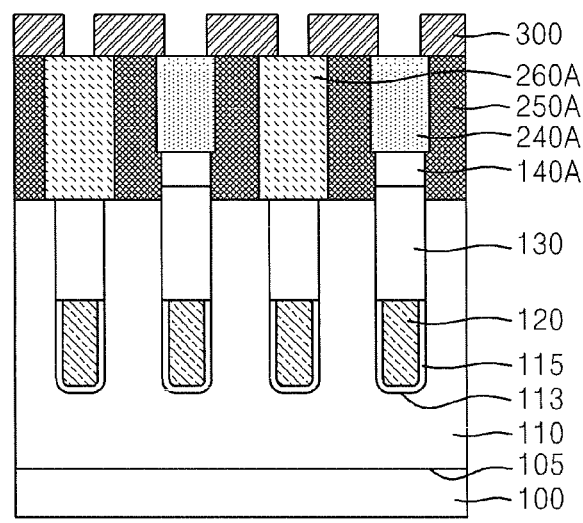
Figure 14A:
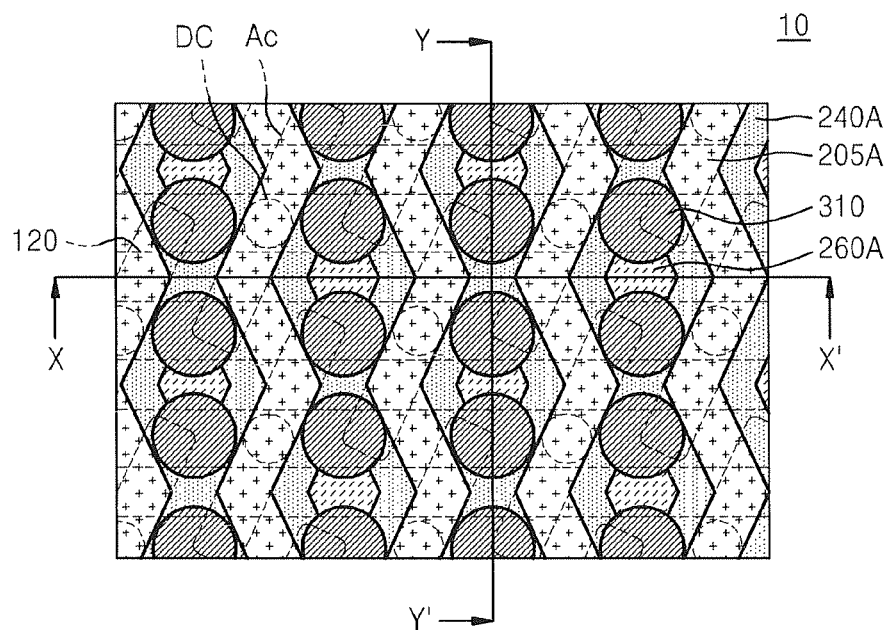
Figure 14B:
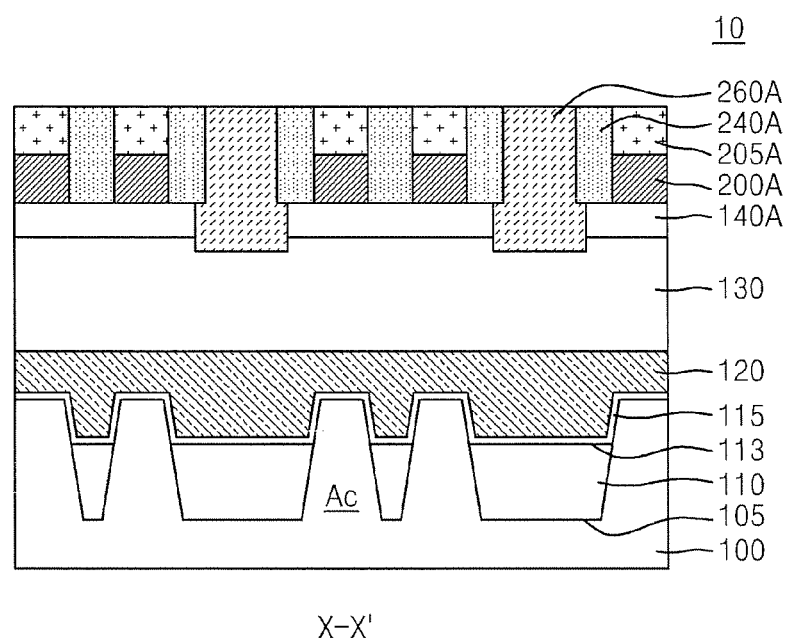
Figure 14C:
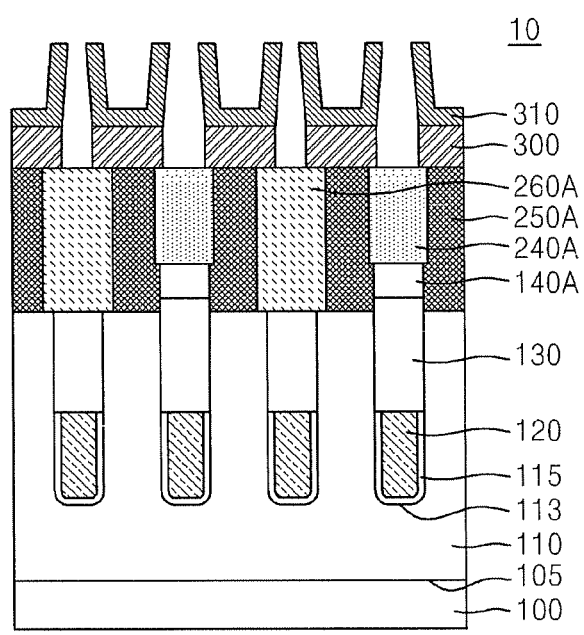

Referring now to FIGS. 13A through 13C, a landing pad 300 may be formed on the upper surface of the buried contact 250A. The buried contact 250A and the landing pad 300 may be formed of the same material or different materials.

Referring now to FIGS. 14A through 14C, a capacitor bottom electrode 310 may be formed on an upper surface of the landing pad 300. A landing pad 300 that is conductive may be used in order to increase a contact area between the capacitor bottom electrode 310 and the land pad 300. By increasing the contact area by using the landing pad 300, contact resistance between the buried contact 250A and the capacitor bottom electrode 310 may be reduced. In some embodiments, a direct contact DC may be disposed approximately in a center portion of the active area Ac, and the buried contact 250A may be disposed at two ends of the active area Ac. As the buried contact 250A is disposed at the two ends of the active area Ac, the landing pad 300 may be adjacent to the two ends of the active area Ac so as to partially overlap the buried contact 250A.

Referring now to FIGS. 15A through 23C, processing steps in the fabrication of a semiconductor device 20 (see FIGS. 23A through 23C) according to some embodiments of the inventive concept will be discussed. The steps illustrated in FIGS. 15A through 23C are performed on the substrate 100 similar to those discussed above with respect to FIGS. 1A through 3C.

Differences between the semiconductor device 20 and the semiconductor device 10 of FIGS. 1A through 14C will be discussed. Materials used in both embodiments are the same and thus, description thereof will be omitted. FIGS. 15A, 16A through 23A are plan views of the semiconductor device 20 (see FIG. 23A). In order to clearly illustrate the relative position relationships in the plan views, an active area Ac, a word line 120, and a direct contact DC are illustrated by a dotted line. FIGS. 15B, 16B through 23B are cross sections corresponding to cross-sections of FIGS. 15A, 16A through 23B cut along a line X-X'. FIGS. 15C, 16C through 23C are cross sections corresponding to cross-sections of FIGS. 15A, 16A through 23A cut along a line Y-Y'.

Figure 15A:
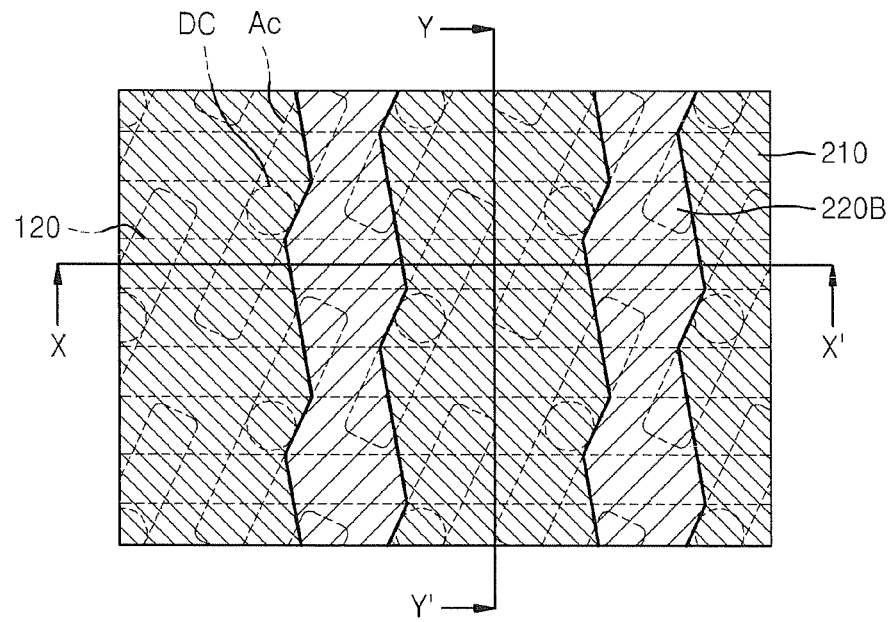
FIGS. 15A through 23C are diagrams illustrating processing steps in the fabrication semiconductor devices according to some embodiments of the inventive concept.
Figure 15B:
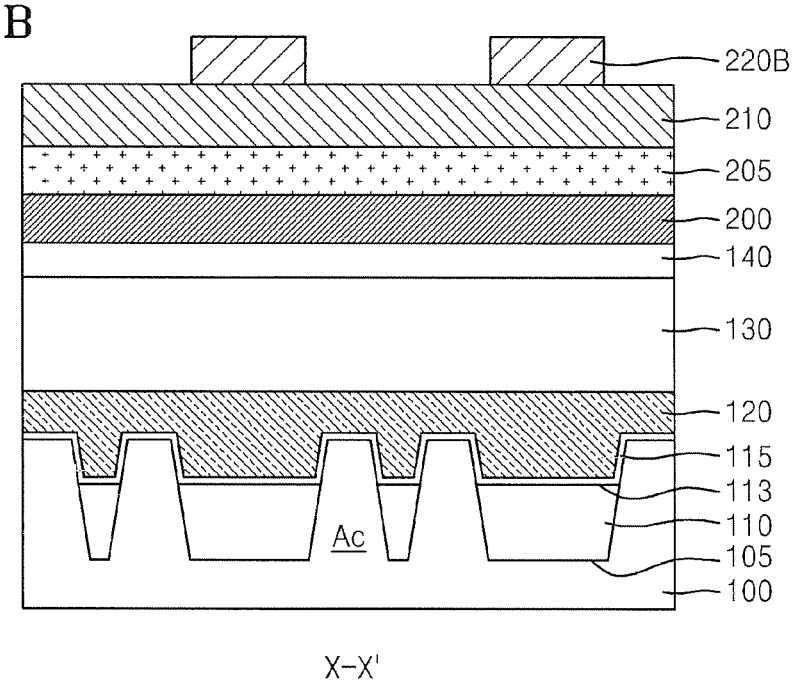
Figure 15C:
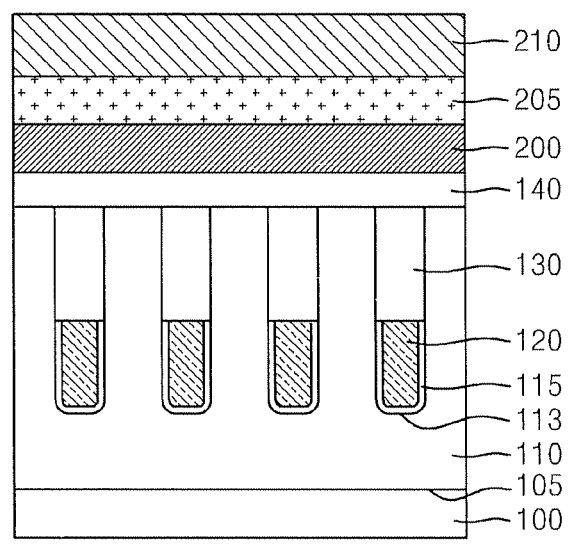

Referring now to FIGS. 15A through 15C, a photosensitive layer is deposited on the hard mask 210 for patterning a bit line. A plurality of photosensitive layer patterns 220B that have a variable width and a symmetrical shape and are spaced apart from one another are formed through exposure and development operations. In a subsequent operation, a sidewall profile of a bit line 200B (see FIG. 19A) may be determined by a sidewall profile of the photosensitive layer patterns 220B.

Figure 16A:
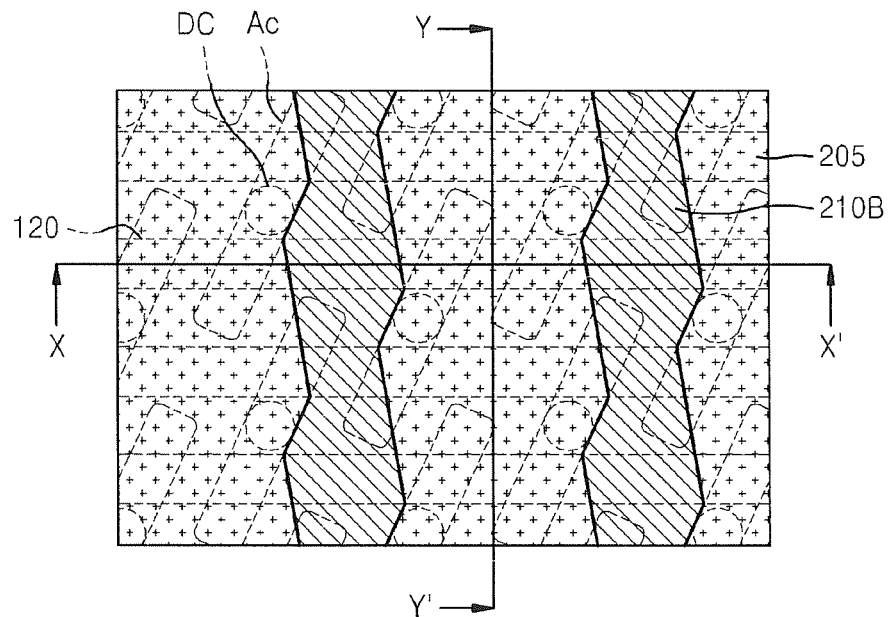
Figure 16B:
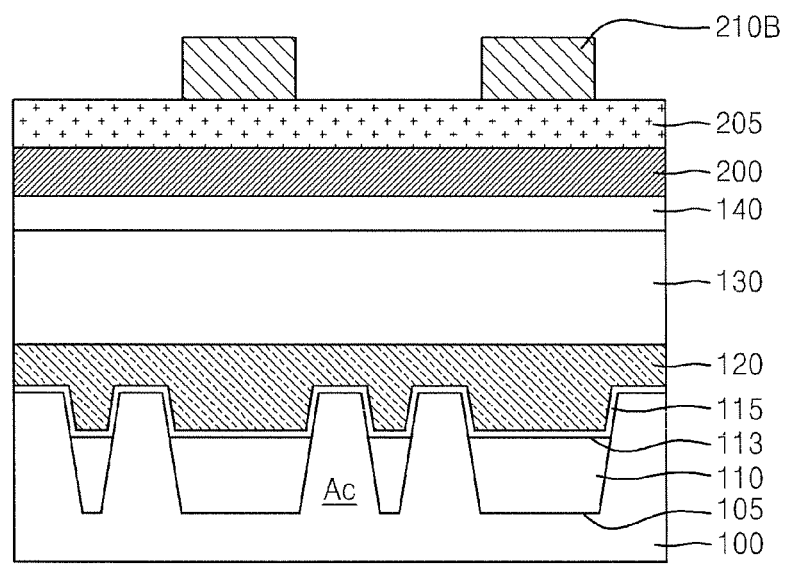
Figure 16C:
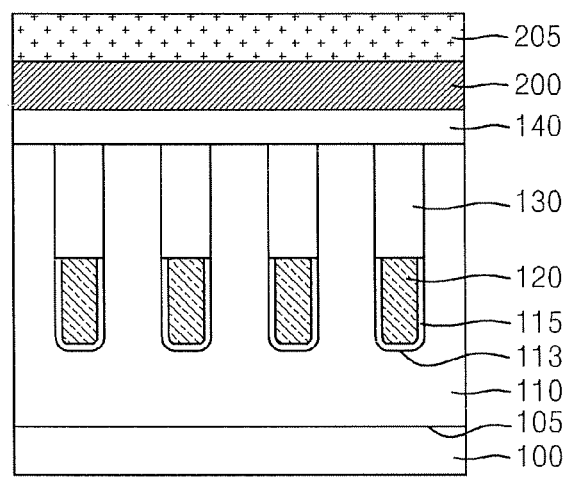

Referring now to FIGS. 16A through 16C, the photosensitive layer patterns 220B are used as an etching mask to perform a dry etching operation, thereby forming a hard mask pattern 210B.

Figure 17A:
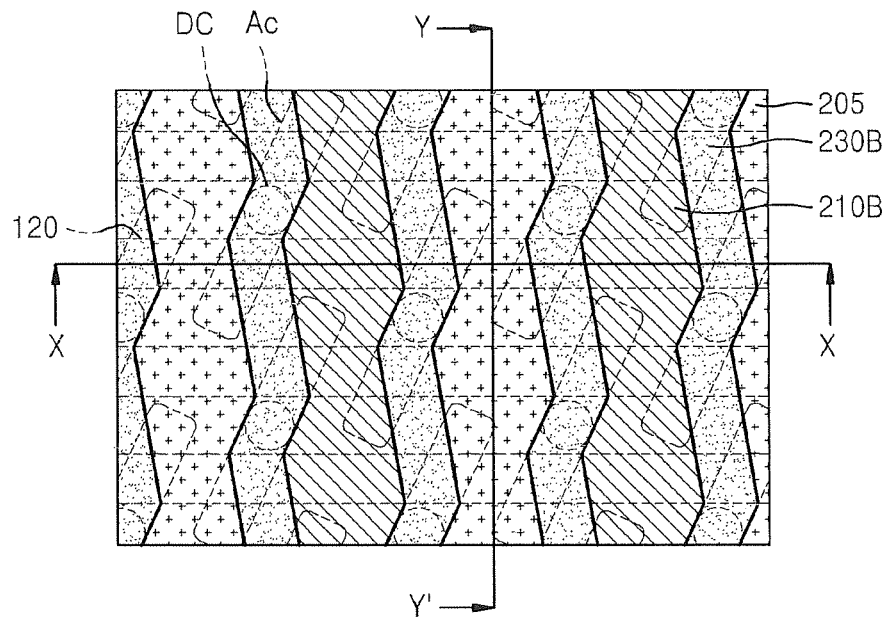
Figure 17B:
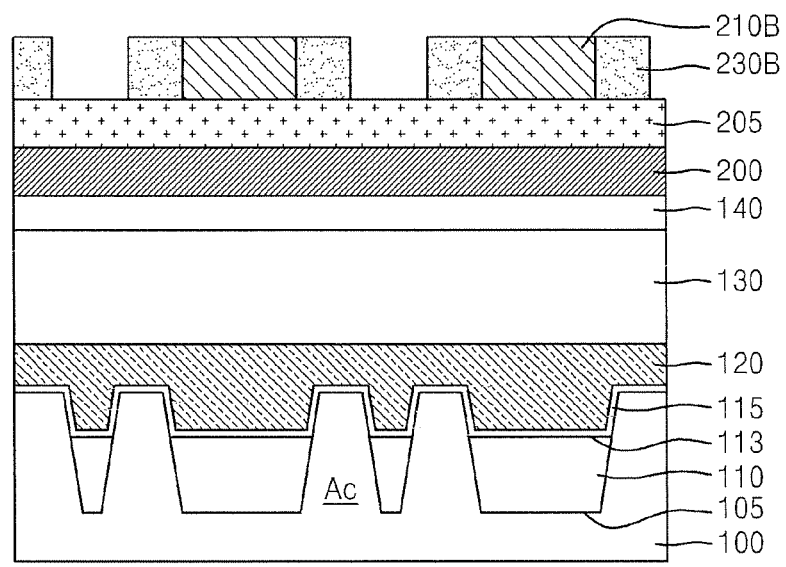
Figure 17C:
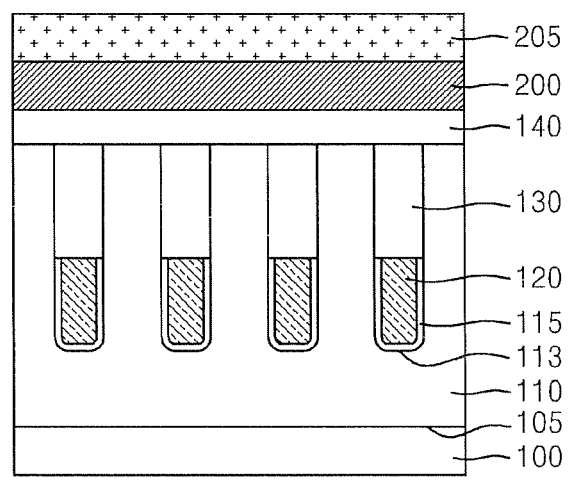

Referring now to FIGS. 17A through 17C, a spacer 230B for forming a bit line 230B is formed on two sidewalls of the hard mask pattern 210B. To form the spacer 230B for forming a bit line, first, an insulation layer that fills the space between the hard mask patterns 210B is formed, and then the insulation layer is etched by using an etchback operation to expose an upper surface of the hard mask pattern 210B, and the spacer 230B for forming a bit line may be left on the two sidewalls of the hard mask pattern 210B. The spacer 230B for forming a bit line transfers the shapes of the bit line 200B and an insulation capping line 205B (see FIGS. 19A and 19B).

Figure 18A:
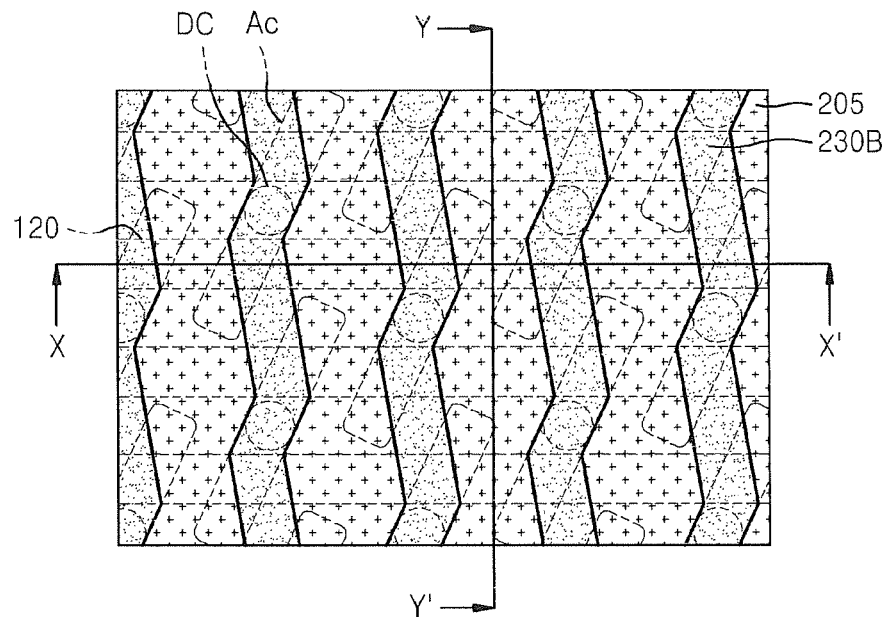
Figure 18B:
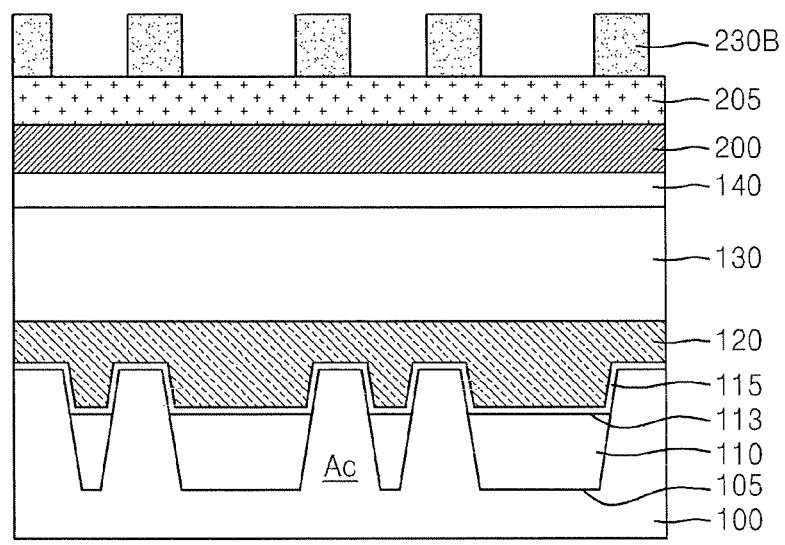
Figure 18C:
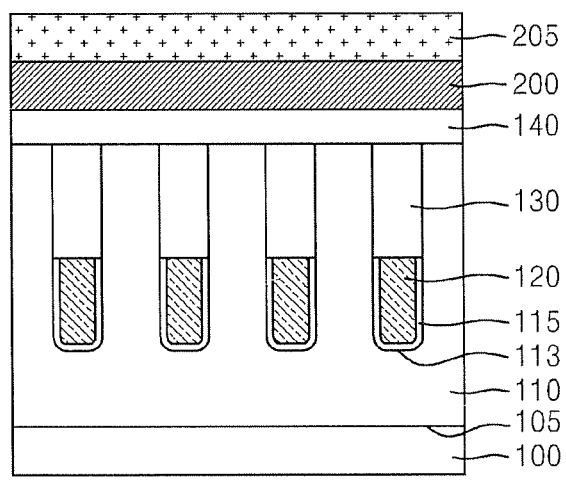

Referring to FIGS. 18A through 18C, the hard mask pattern 210B is removed to expose the spacer 230B for forming a bit line.

Figure 19A:
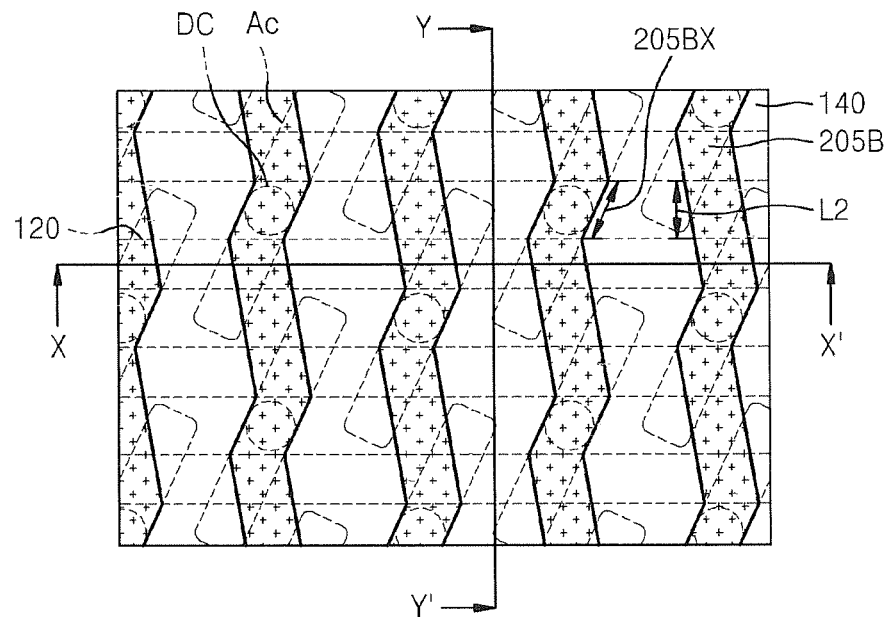
Figure 19B:
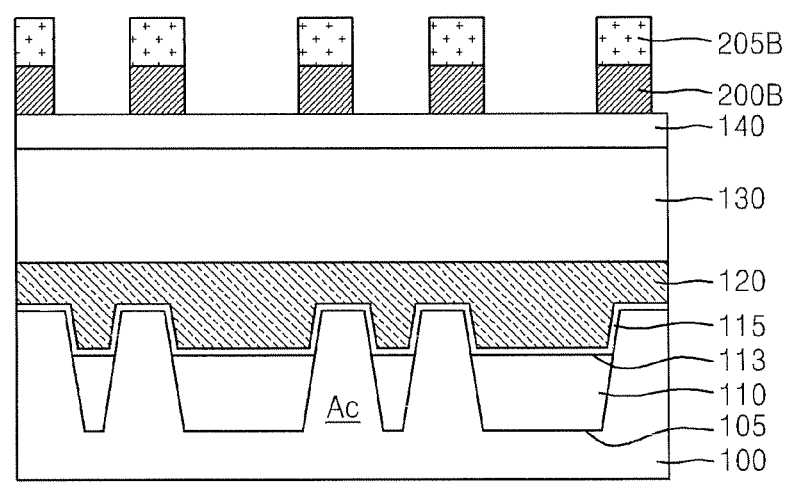
Figure 19C:
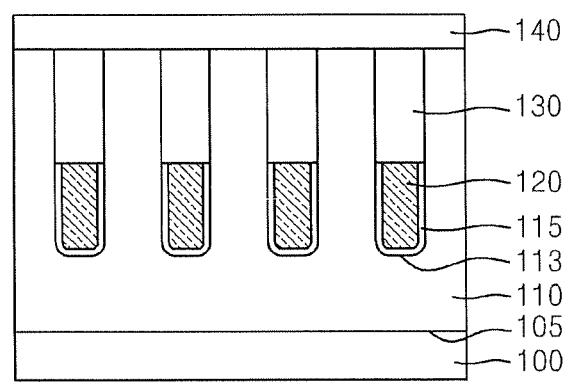
Figure 20A:
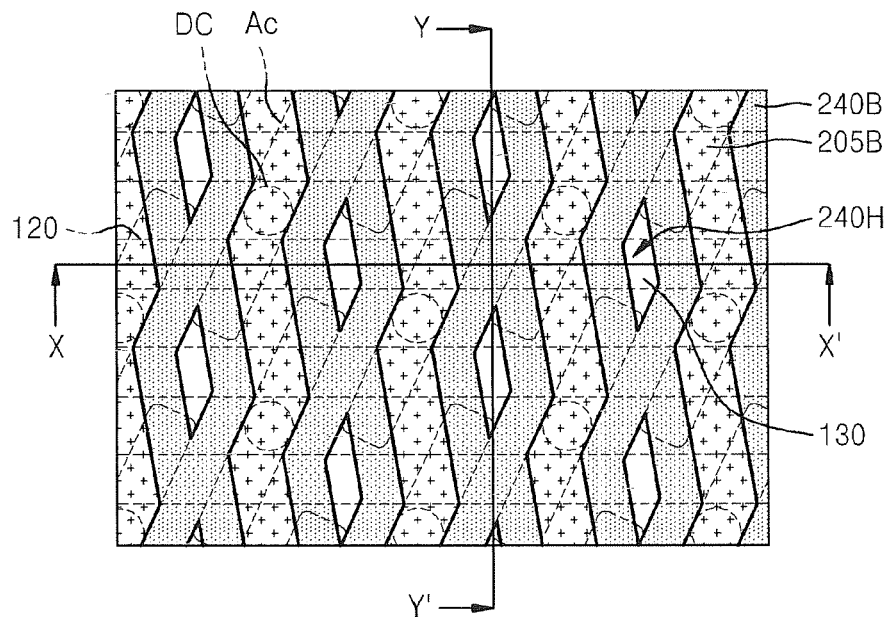
Figure 20B:
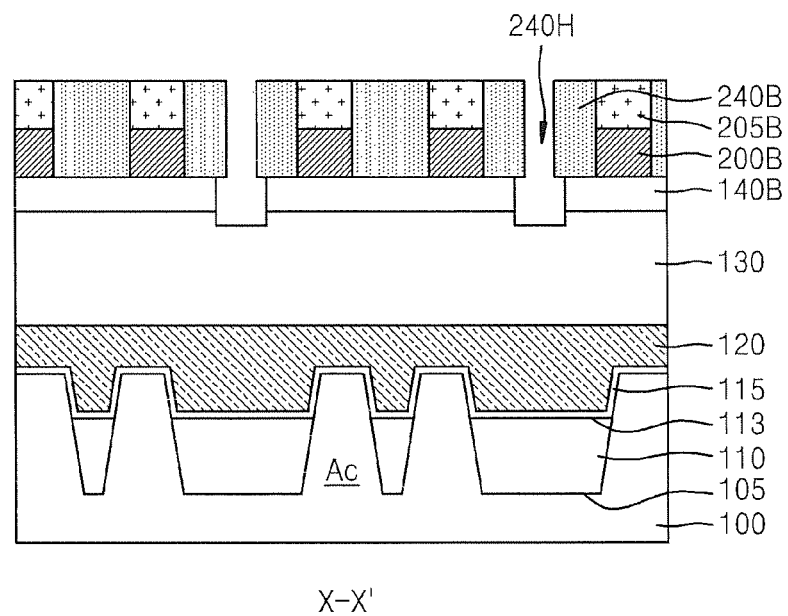
Figure 20C:
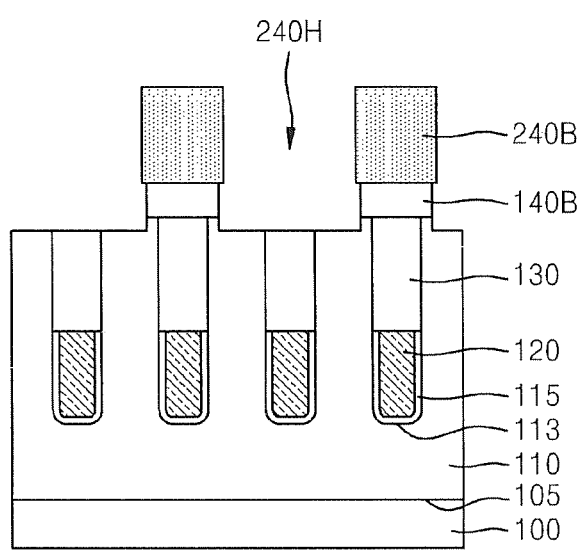

Referring to FIGS. 19A through 19C, the spacer 230B for forming a bit line is used as an etching mask to etch the bit line forming layer 200 and the insulation capping layer 205, thereby forming a bit line 200B and an insulation capping line 205B, to which the shape of the spacer 230B for forming a bit line is transferred. Then the spacer 230B for forming a bit line is removed. The bit line 200B may include a first bit line portion 205BX that overlaps at least one of the plurality of active areas Ac in parallel and a length of the first bit line portion 205BX may be equal to or greater than a distance L2 between two adjacent ones of the plurality of word lines 120. The first bit line portion 205BX may not overlap the plurality of word lines 120. The bit line 200B is nonlinear and may be, for example, a zigzag shape, a wavy shape, or a meandering shape.

Referring now to FIGS. 9A through 9C, an integral spacer 240B having a plurality of spaces 240H is formed on two sidewalls of the bit line 200B and the insulation capping line 205B. To form the integral spacer 240B, first, an insulation layer that fills space which is between the bit lines 200B and between the insulation capping lines 205B is formed, and then the insulation layer is etched by using an etchback operation to expose an upper surface of the insulation capping line 205B, and the integral spacer 240B may be left on the two sidewalls of the bit line forming layer 200B and the insulation capping line 205B. When performing the etchback operation for forming the integral spacer 240B, portions of the insulation layer pattern 140 and the buried insulation layer 130 are etched. Then, a wet etching operation may be performed to excessively etch an insulation layer pattern 140B so that a portion of a bottom surface of the integral spacer 240B is exposed and forms an undercut area.

The integral spacer 240B has a variable width in that a wide width portion and a narrow width portion are alternately repeated, and a plurality of spaces 240H are formed in the wide width portion. The plurality of spaces 240H may be arranged in a row. The integral spacer 240B that is formed internally with respect to a pair of adjacent bit lines may be formed as a single unit so that the plurality of spaces 240H are formed, and the plurality of spaces 240H may expose two adjacent active areas Ac1 and Ac2 from among the plurality of active areas Ac. Thus, the plurality of spaces 240H, in which a conductive pattern 250 which is for forming a buried contact (see FIG. 21A) and abuts on the two active areas may be formed without an exposure operation, may be provided.

Figure 21A:
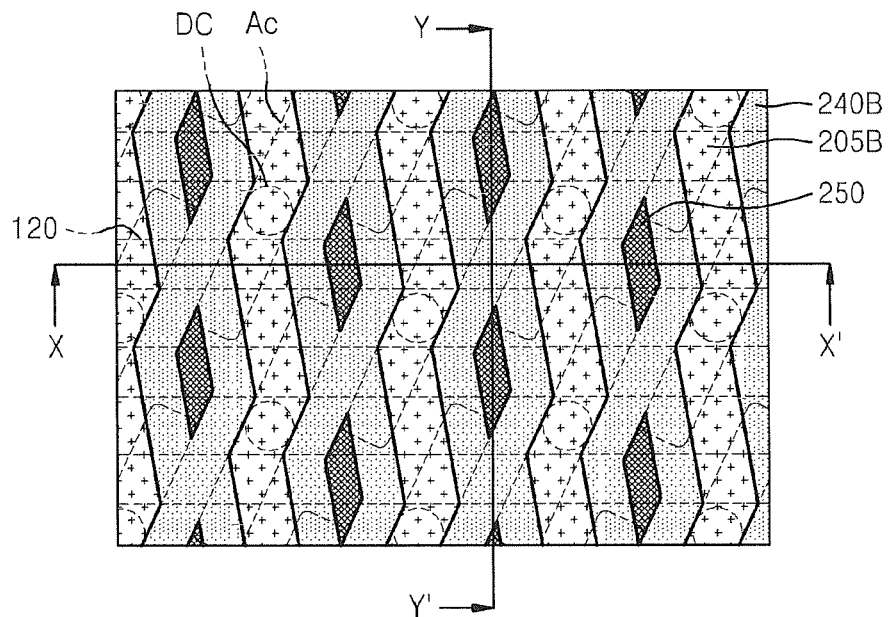
Figure 21B:
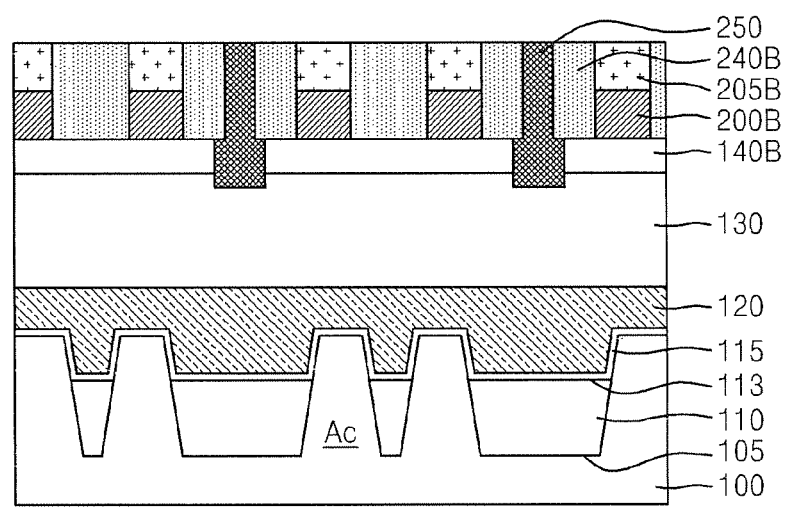
Figure 21C:
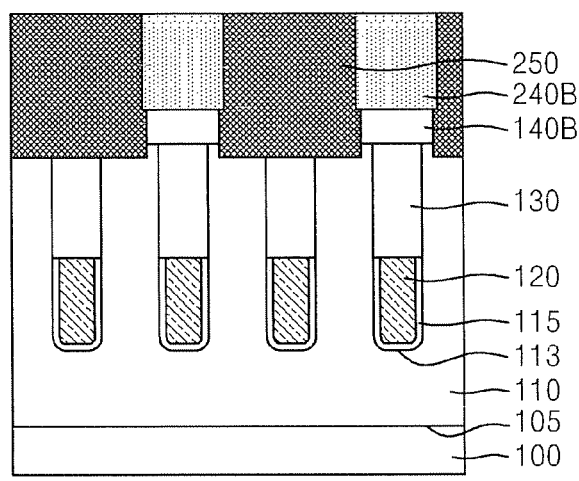

Referring now to FIGS. 21A through 21C, a contact pattern 250 for forming a buried contact is formed in the plurality of spaces 240H in the integral spacer 240B. To form the conductive pattern 250 for forming a buried contact, first, a conductive layer that fills the plurality of spaces 240H between the integral spacers 240B is formed, and the conductive layer is etched by using an etchback operation or a CMP operation to expose upper surfaces of the insulation capping line 205B and the integral spacer 240B, and the conductive pattern 250 for forming a buried contact may be left in the plurality of spaces 240H.

Figure 22A:
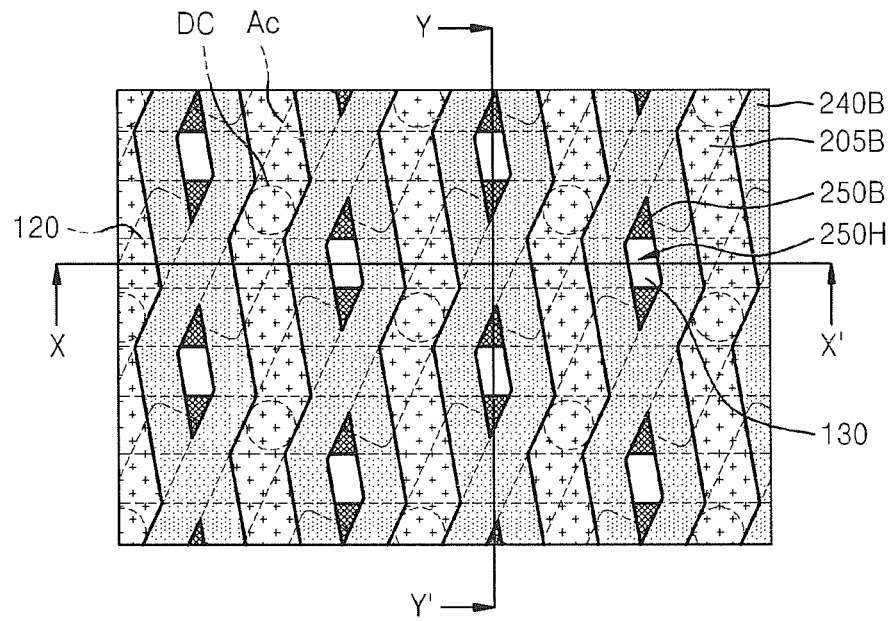
Figure 22B:
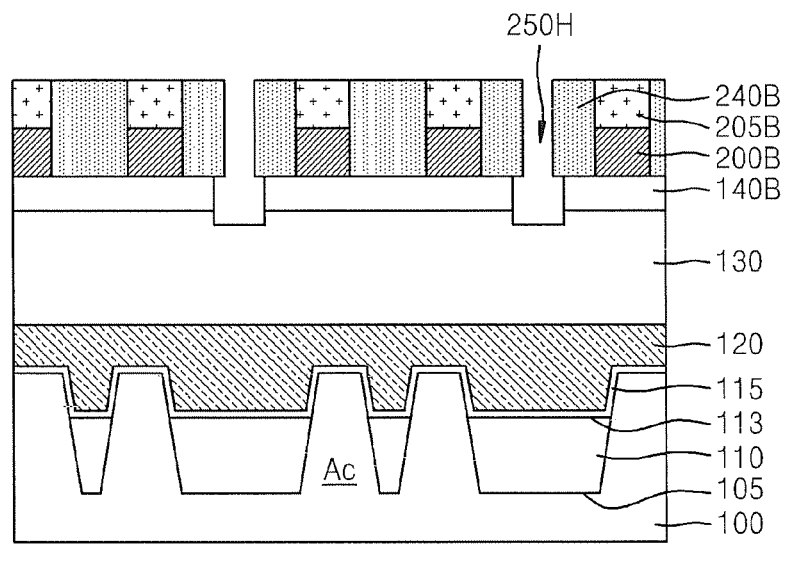
Figure 22C:
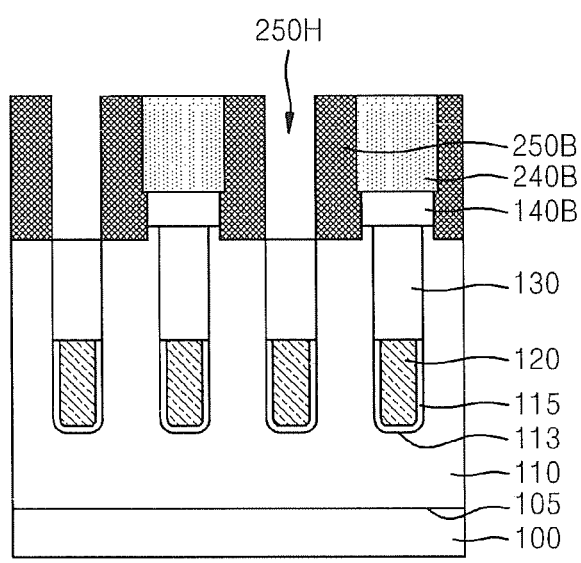

Referring now to FIGS. 22A through 22C, an etching operation is performed to divide the conductive pattern 250 for forming a buried contact, which is formed in the plurality of spaces 240H (see FIG. 21A), into two spaces, to provide space 250H in which a contact separating insulation layer 260B is to be formed.

Figure 23A:
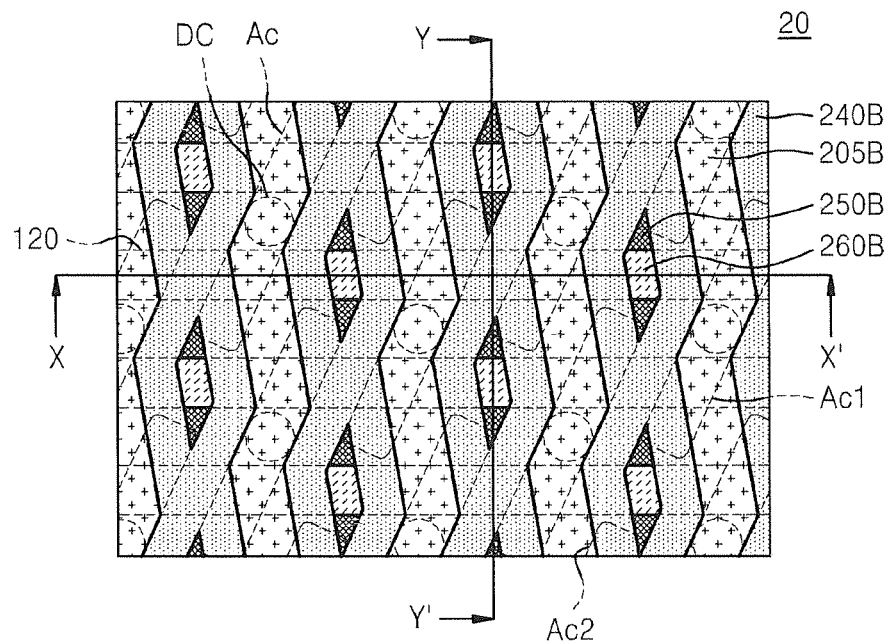
Figure 23B:
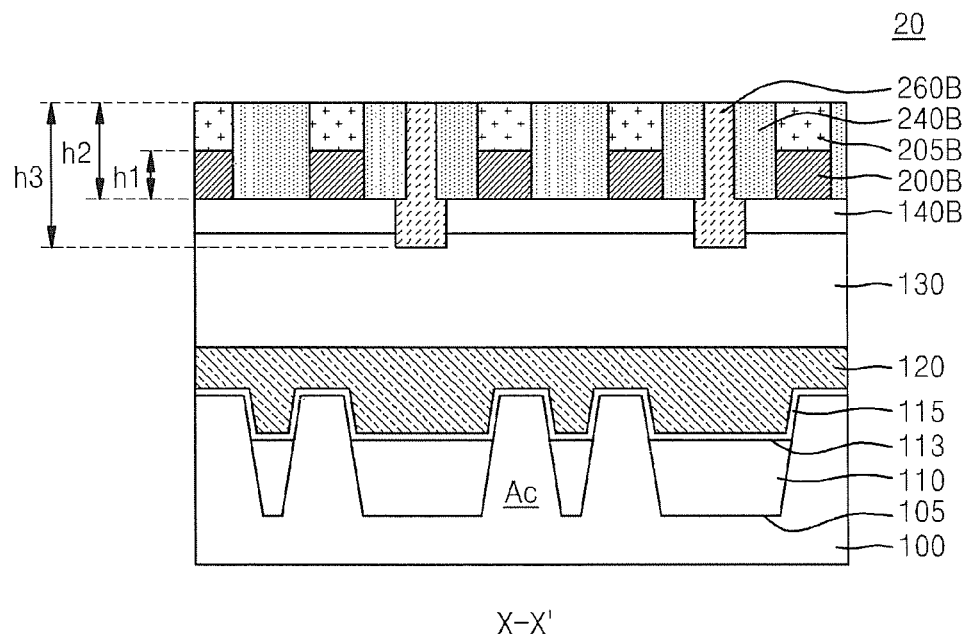
Figure 23C:
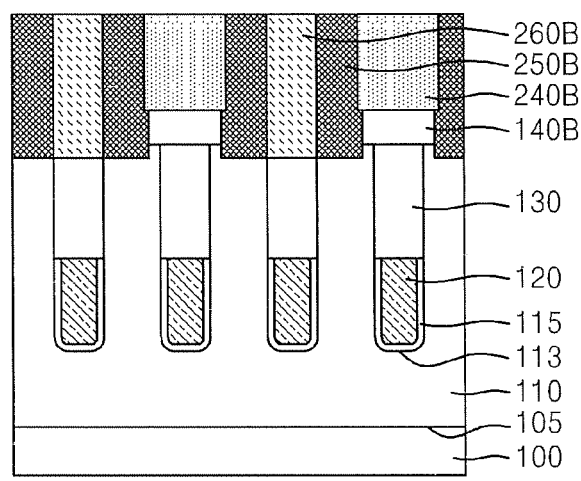

Referring now to FIGS. 23A through 23C, a contact separating insulation layer 260B is filled in the space 250H (see FIGS. 22A through 22C), in which the contact separating insulation layer 260B is to be formed. After forming an insulation layer that fills the space 250H in which the contact separating insulation layer 260B is to be formed, the insulation layer is etched by using an etchback operation or a CMP operation to expose an upper surface of a buried contact 250B, and the contact separating insulation layer 260B may be left in the space 250H (see FIGS. 22A through 22C). The contact separating insulation layer 260B may be formed at a position where it is overlapped with the plurality of word lines 120. A distance h1 between a bottom surface and an upper surface of the bit line 200B may be smaller than a distance h2 between a bottom surface and an upper surface of the integral spacer 240B. A distance h3 between a bottom surface and an upper surface of the contact separating insulation layer 260B may be greater than the distance h2 between the bottom surface and the upper surface of the integral spacer 240B.

Through the above operation, two conductive patterns respectively abutting on the two active areas Ac1 and Ac2, that is, the buried contacts 250B may be formed in the plurality of spaces 240H formed in the spacer 240B. FIG. 23A schematically illustrates two adjacent active areas Ac1 and Ac2 in one of the plurality of spaces 240H in the integral spacer 240B that is selected and two buried contacts 250B that respectively contact the two adjacent active areas Ac1 and Ac2.

After performing the operations of FIGS. 15A through 23C, same or similar operations as those of FIGS. 13A through 14C are performed to form a landing pad 300 and a capacitor bottom electrode 310.

Referring now to FIGS. 24A through 32C, processing steps in the fabrication of semiconductor devices 30 (see FIGS. 32A through 32C) in accordance with embodiments of the inventive concept will be discussed. The steps of FIGS. 24A through 32C are performed on the substrate 100, on which operations that are the same or similar to operations discussed above with respect to FIGS. 1A through 3C. Differences of the semiconductor device 30 from the semiconductor device 10 manufactured according to processing steps of FIGS. 1A through 14C will be discussed. Materials used are the same or similar to those discussed above with respect to FIGS. 1A through 12C, and thus, description thereof will be omitted.

FIGS. 24A through 32A are plan views illustrating processing steps in the fabrication of a semiconductor device 30 (see FIG. 32A) according to some embodiments of the present inventive concept. In order to clearly illustrate the relative position relationships in the plan views, an active area Ac, a word line 120, and a direct contact DC are illustrated by a dotted line. FIGS. 24B through 32B are cross sections corresponding to cross-sections of FIGS. 24A through 32A cut along a line X-X'. FIGS. 24C through 32C are cross sections corresponding to cross-sections of FIGS. 24A and 32A cut along a line Y-Y'.

Figure 24A:
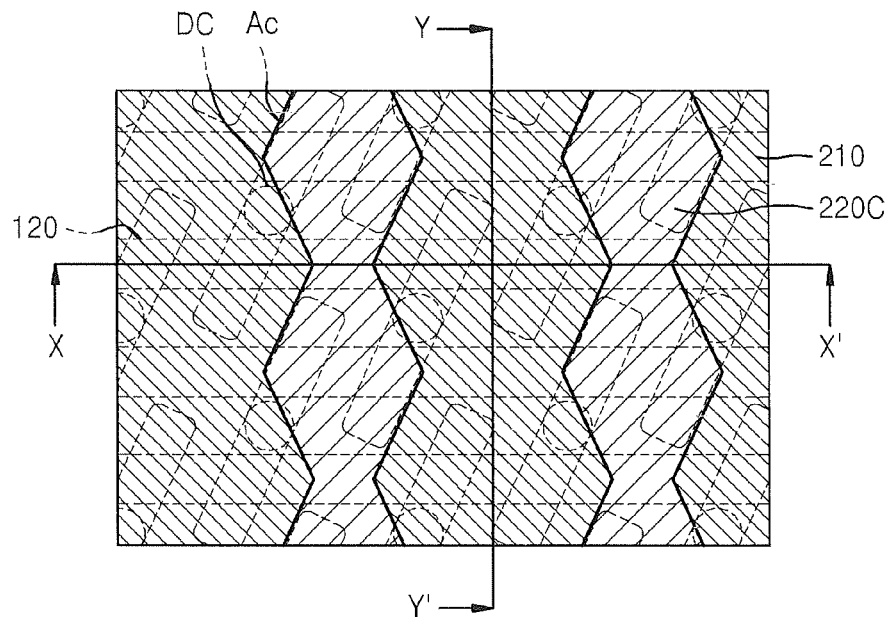
FIGS. 24A through 32C are diagrams illustrating processing steps in the fabrication semiconductor devices according to some embodiments of the inventive concept.
Figure 24B:
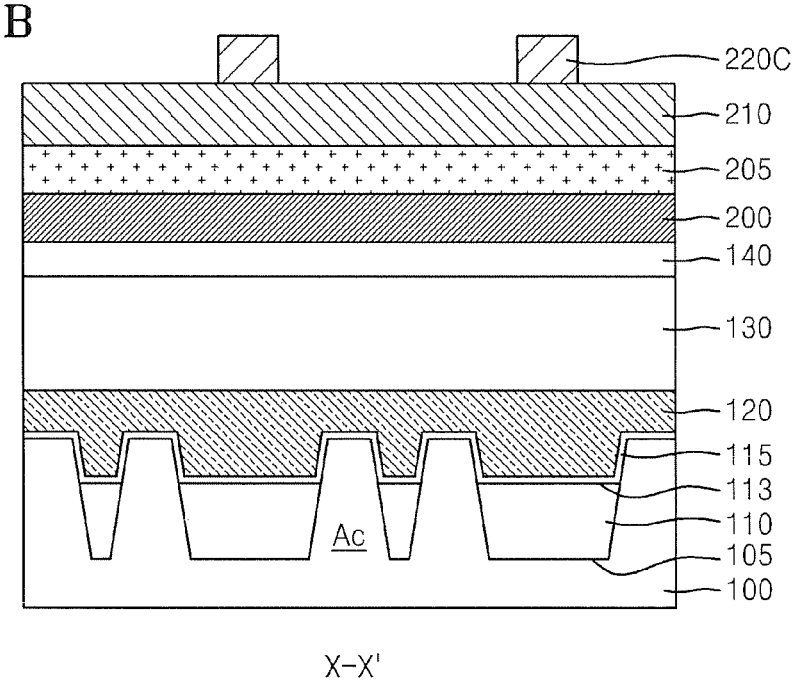
Figure 24C:
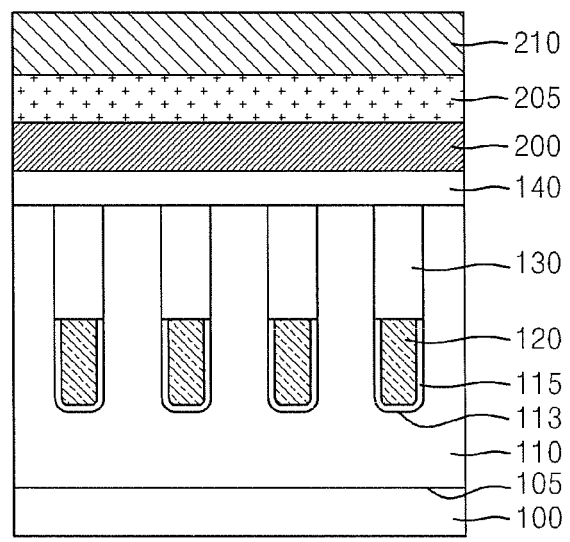

Referring to FIGS. 24A through 24C, a photosensitive layer is deposited on the hard mask 210 for patterning a bit line. Then a plurality of photosensitive layer patterns 220C that have a variable width and a symmetrical shape and are spaced apart from one another are formed through exposure and development operations. In a subsequent operation, a sidewall profile of a bit line 200C (see FIG. 28A) may be determined by a sidewall profile of the photosensitive layer patterns 220C.

Figure 25A:
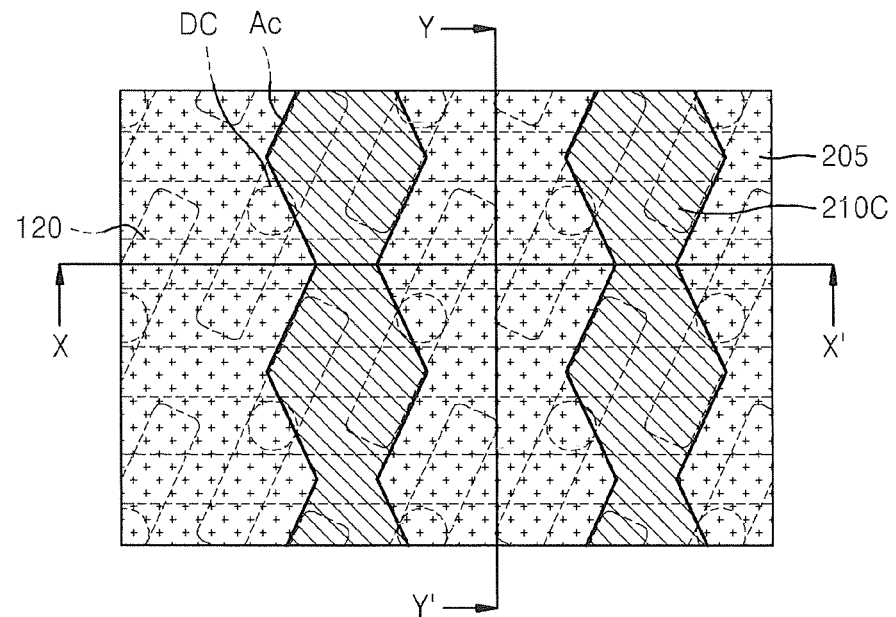
Figure 25B:
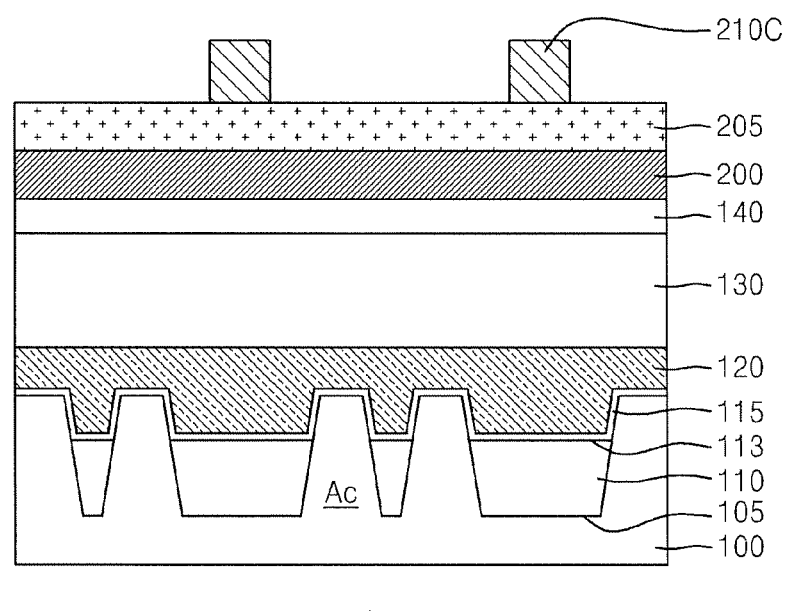
Figure 25C:
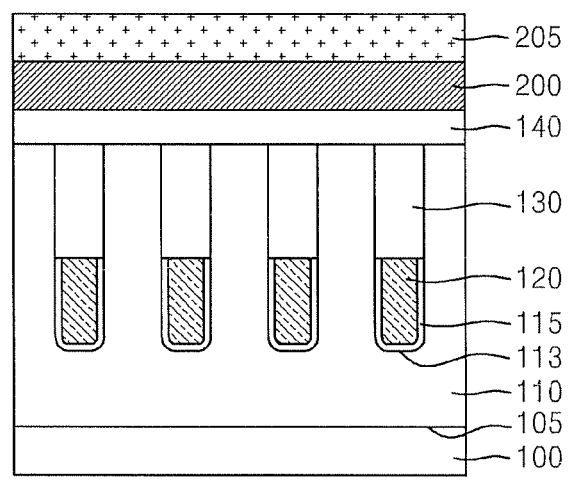

Referring now to FIGS. 25A through 25C, the photosensitive layer patterns 220C are used as an etching mask to perform a dry etching operation, thereby forming a hard mask pattern 210C.

Figure 26A:
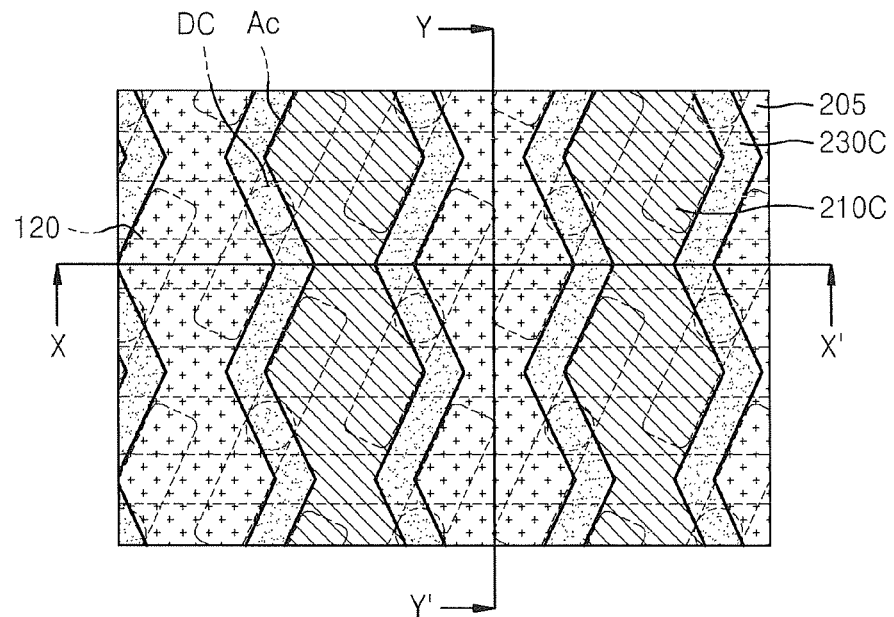
Figure 26B:
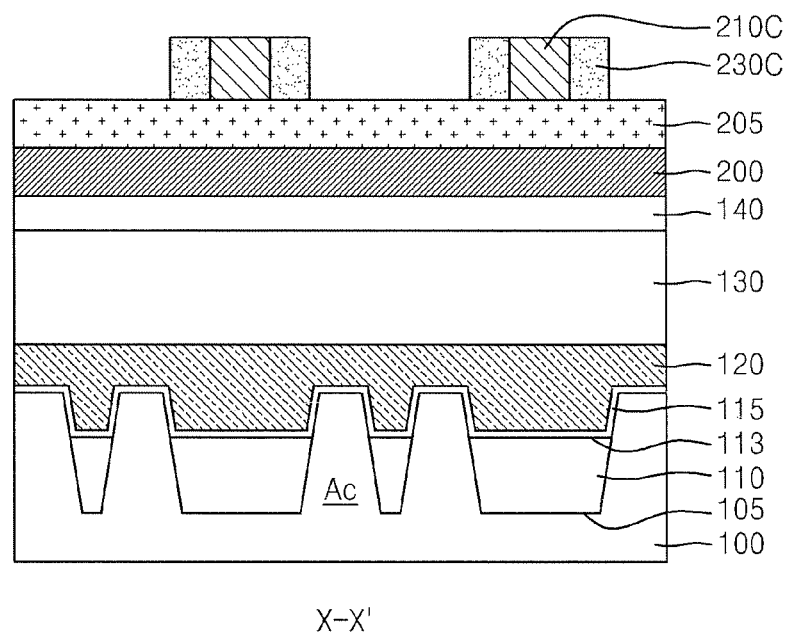
Figure 26C:
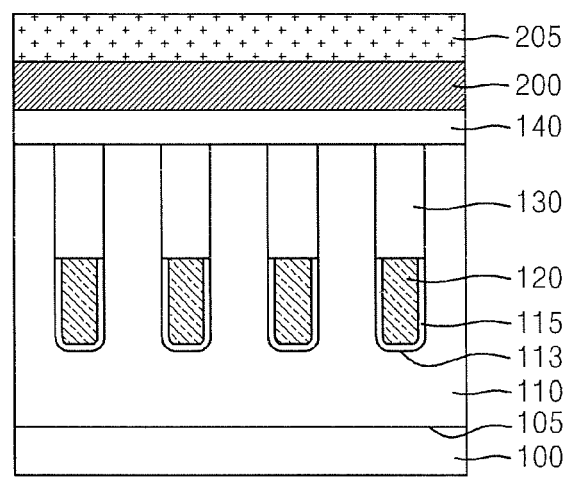

Referring now to FIGS. 26A through 26C, a spacer 230C for forming a bit line 230C is formed on two sidewalls of the hard mask pattern 210C. To form the spacer 230C for forming a bit line, first, an insulation layer that fills space between the hard mask patterns 210C is formed, and then the insulation layer is etched by using an etchback operation to expose an upper surface of the hard mask pattern 210C, and the spacer 230C for forming a bit line may be left on the two sidewalls of the hard mask pattern 210C. The spacer 230C for forming a bit line transfers the shapes of the bit line 200C and an insulation capping line 205C (see FIGS. 28A and 28B).

Figure 27A:
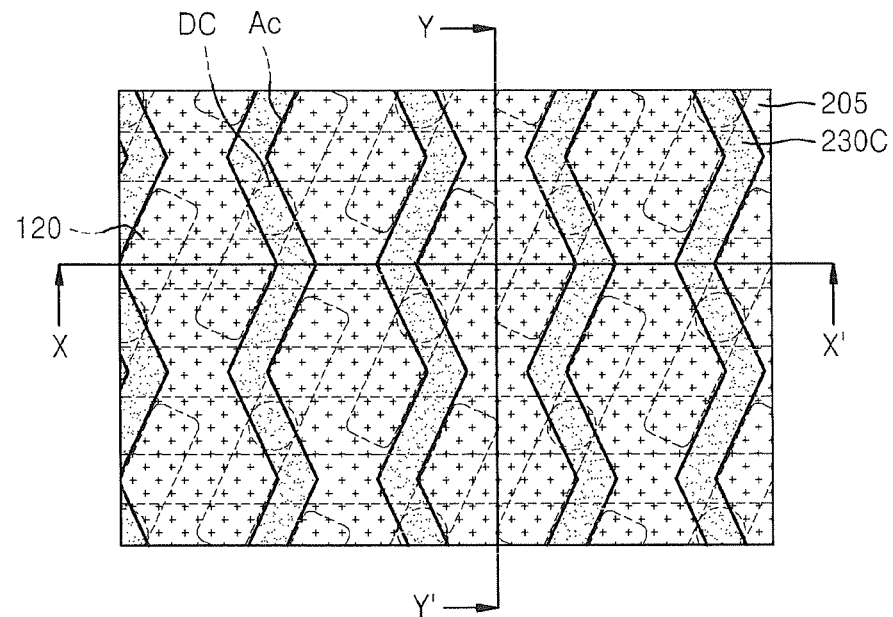
Figure 27B:
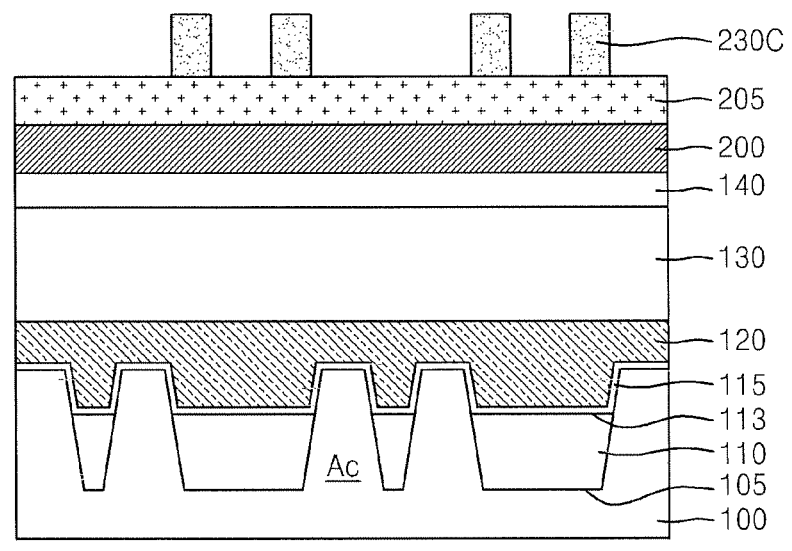
Figure 27C:
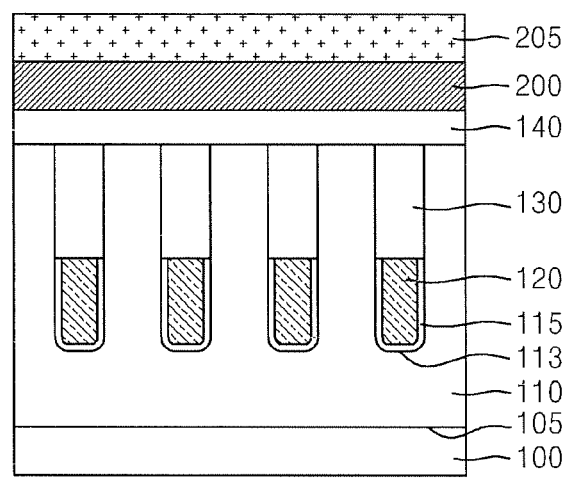

Referring now to FIGS. 27A through 27C, the hard mask pattern 210C is removed to expose the spacer 230C for forming a bit line.

Figure 28A:
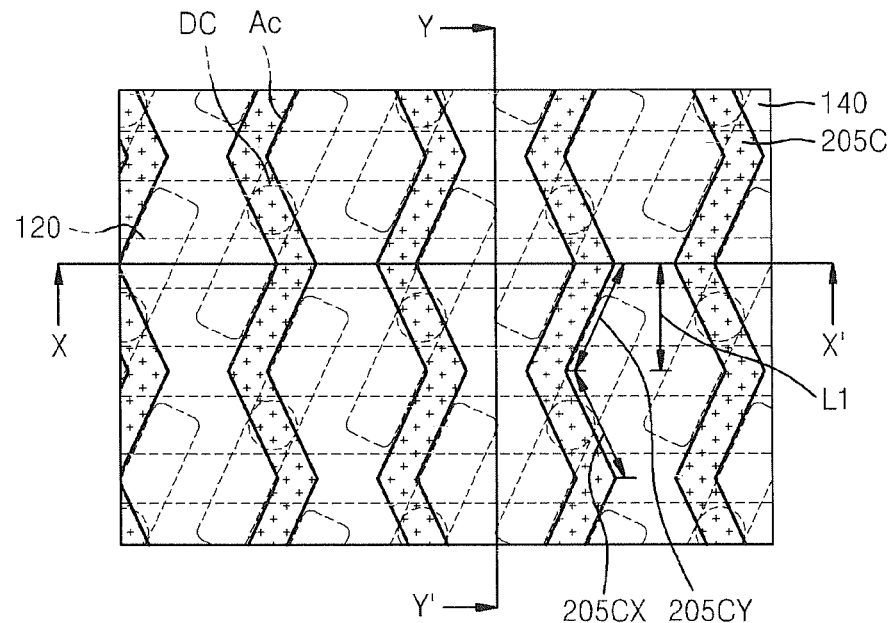
Figure 28B:
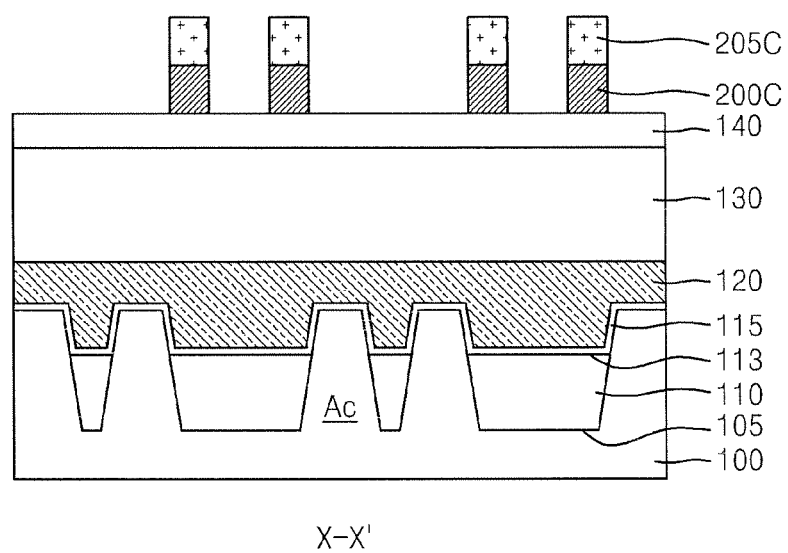
Figure 28C:
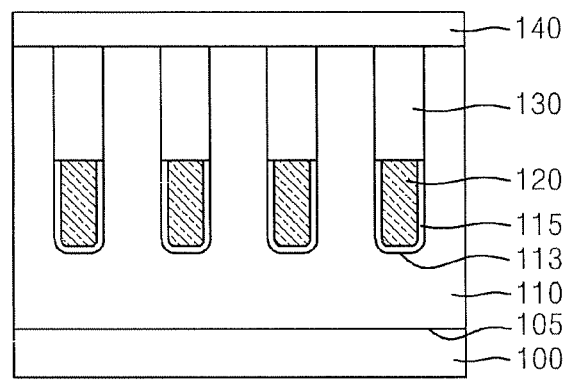

Referring now to FIGS. 28A through 28C, the spacer 230C for forming a bit line is used as an etching mask to etch the bit line forming layer 200 and the insulation capping layer 205, thereby forming a bit line 200C and an insulation capping line 205A, to which the shape of the spacer 230C for forming a bit line is transferred. Then the spacer 230C for forming a bit line is removed. The bit line 200C includes a first bit line portion 205CX that crosses at least one of the plurality of active areas Ac and overlaps the same and a second bit line portion 205CY that does not overlap the plurality of active areas Ac, and a length of the second bit line portion 205CY may equal to or greater than the pitch L1 of the plurality of word lines 120. In addition, the bit line 200C may further include a direct contact DC that overlaps the first bit line portion 205CX and connects the plurality of bit lines 200C and the plurality of active areas Ac. In addition, the second bit line portion 205CY may overlap two adjacent ones of the plurality of word lines 120. The bit line 200C is nonlinear and may be, for example, a zigzag shape, a wavy shape, or a meandering shape.

Figure 29A:
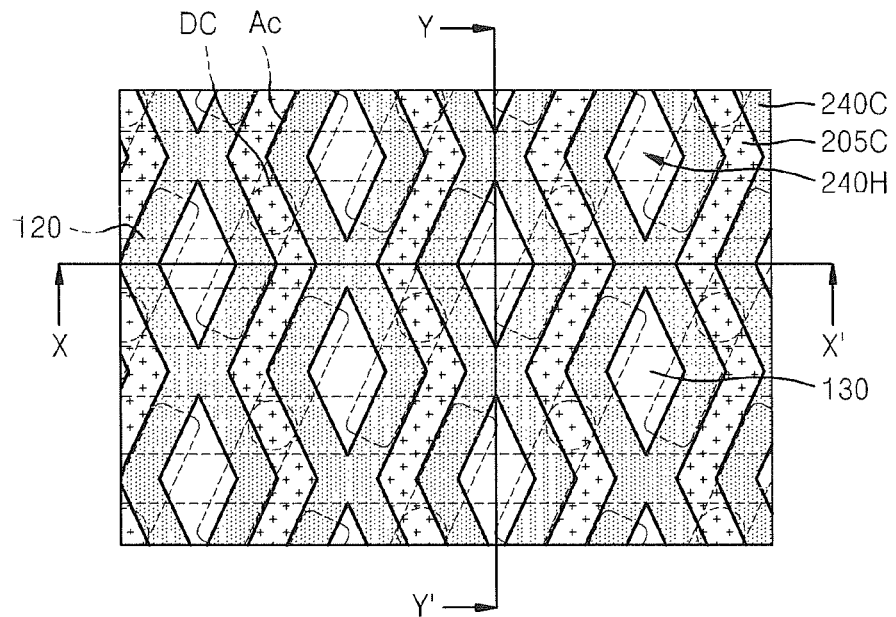
Figure 29B:
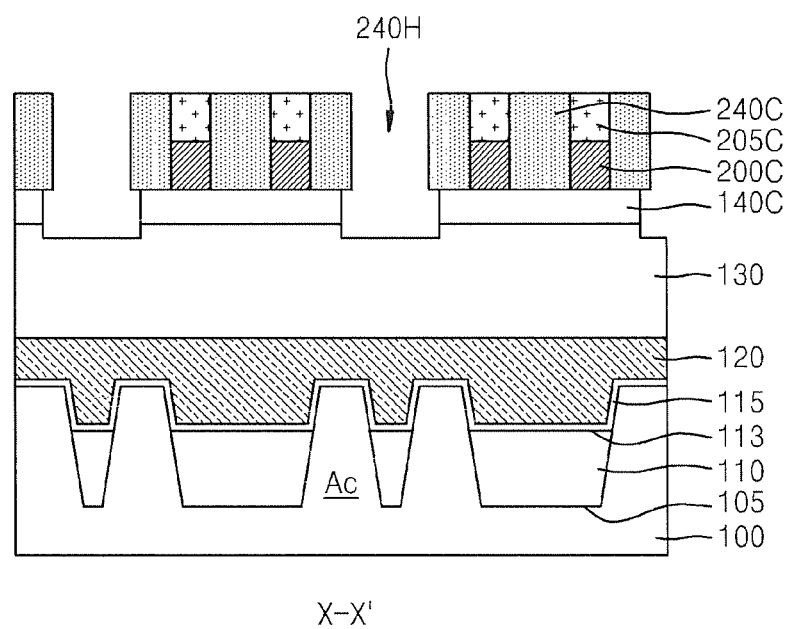
Figure 29C:
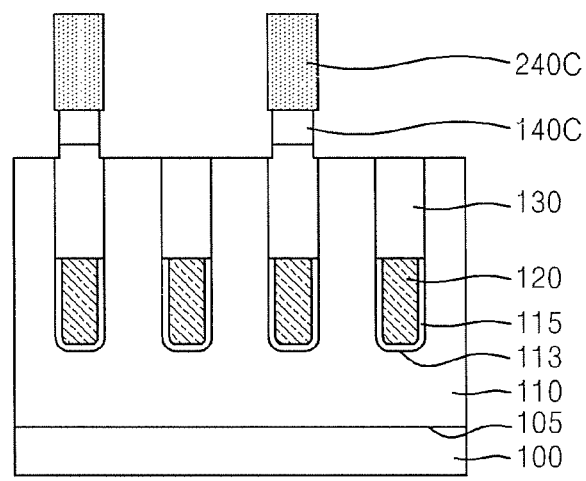

Referring now to FIGS. 29A through 29C, an integral spacer 240C having a plurality of spaces 240H is formed on two sidewalls of the bit line 200C and the insulation capping line 205C. To form the integral spacer 240C, first, an insulation layer that fills space between the bit lines 200C and space between the insulation capping lines 205C is formed in the space, and then the insulation layer is etched by using an etchback operation to expose an upper surface of the insulation capping line 205C, and the integral spacer 240C may be left on the two sidewalls of the bit line forming layer 200C and the insulation capping line 205C. When performing the etchback operation for forming the integral spacer 240C, portions of the insulation layer pattern 140 and the buried insulation layer 130 are etched. Then, a wet etching operation may be performed to excessively etch an insulation layer pattern 140C so that a portion of a bottom surface of the integral spacer 240C is exposed and thus to form an undercut area.

The integral spacer 240C has a variable width in that a wide width portion and a narrow width portion are alternately repeated, and a plurality of spaces 240H are formed in the wide width portion. The plurality of spaces 240H may be arranged in a row. The integral spacer 240C that is formed internally with respect to a pair of adjacent bit lines may be formed as a single unit so that the plurality of spaces 240H are formed, and the plurality of spaces 240H may expose two adjacent active areas Ac1 and Ac2 from among the plurality of active areas Ac. Thus, the plurality of spaces 240H, in which a conductive pattern 250 which is for forming a buried contact (see FIG. 30C) and abuts on the two active areas may be formed without an exposure operation, may be provided.

Figure 30A:
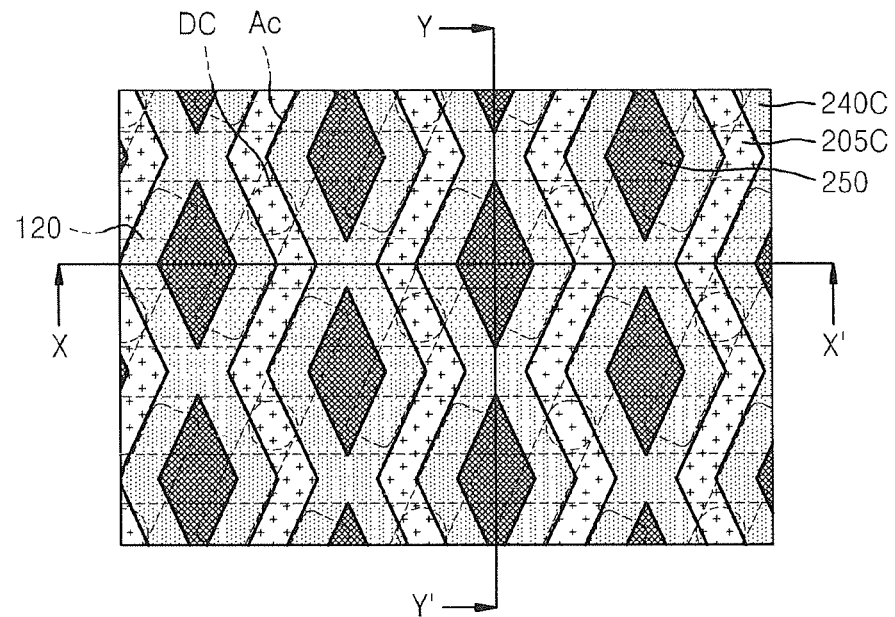
Figure 30B:
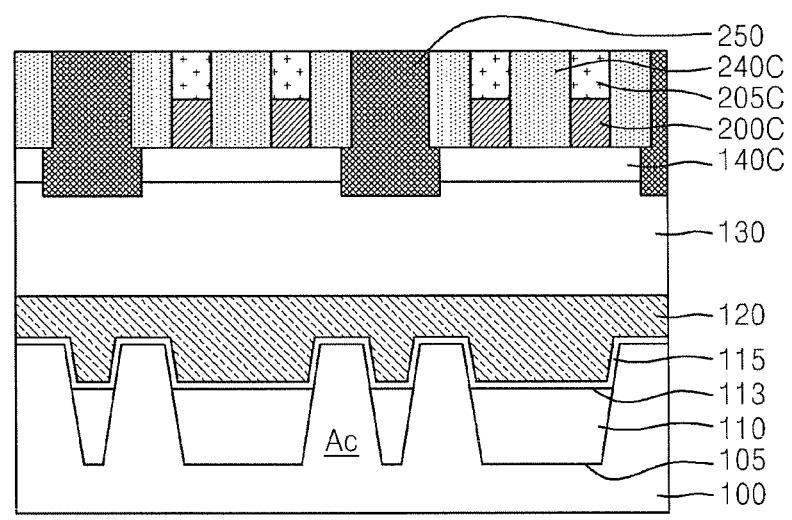
Figure 30C:
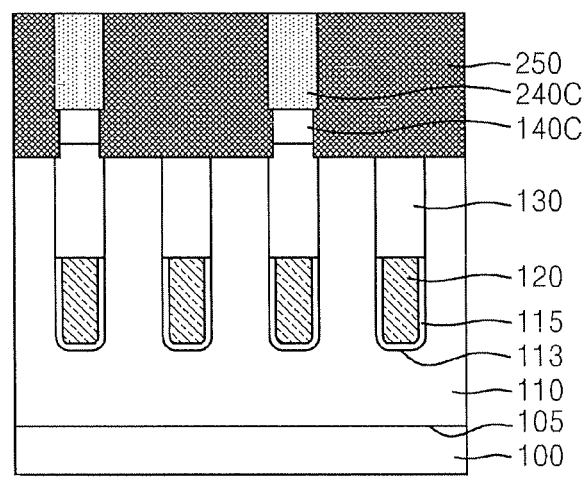

Referring now to FIGS. 30A through 30C, a contact pattern 250 for forming a buried contact is formed in the plurality of spaces 240H in the integral spacer 240C. To form the conductive pattern 250 for forming a buried contact, first, a conductive layer that fills the plurality of spaces 240H between the integral spacers 240C is formed, and the conductive layer is etched by using an etchback operation or a CMP operation to expose upper surfaces of the insulation capping line 205C and the integral spacer 240C, and the conductive pattern 250 for forming a buried contact may be left in the plurality of spaces 240H.

Figure 31A:
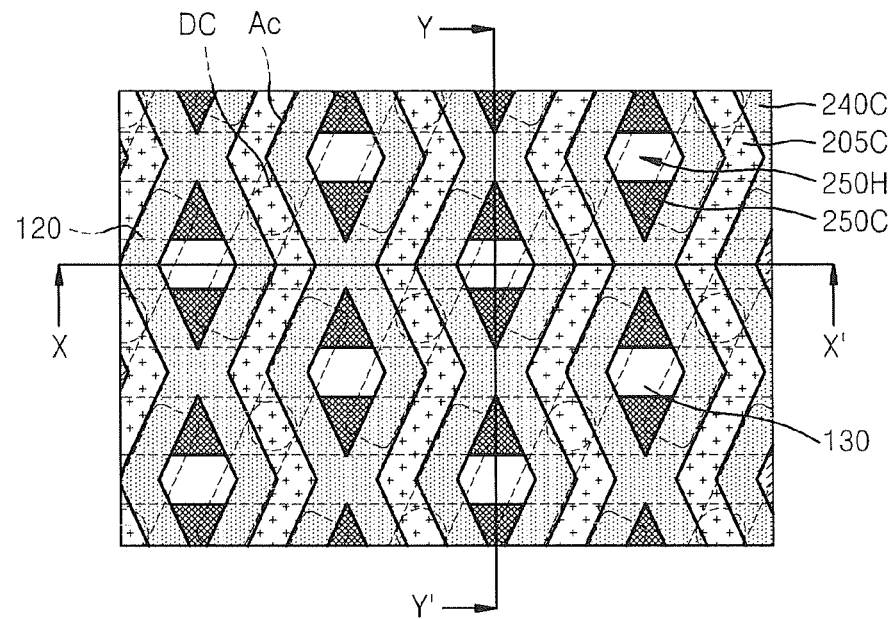
Figure 31B:
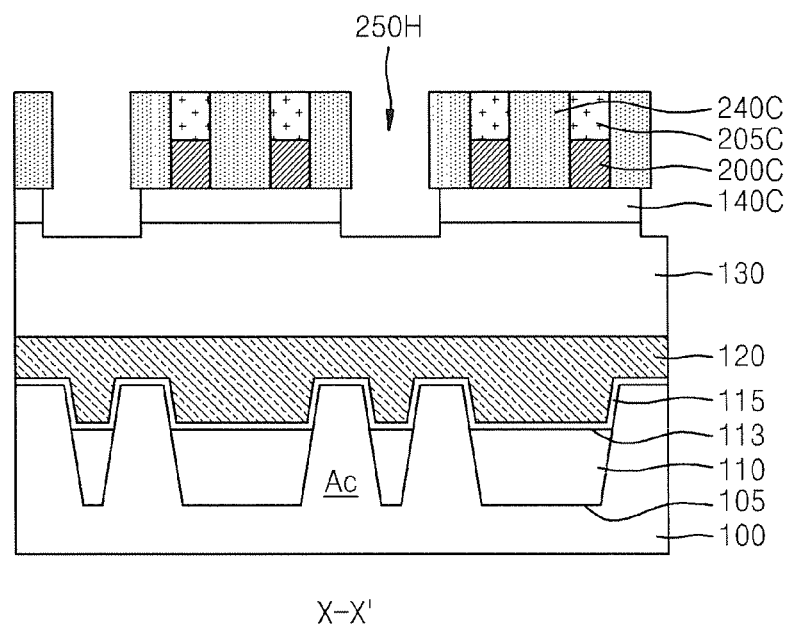
Figure 31C:
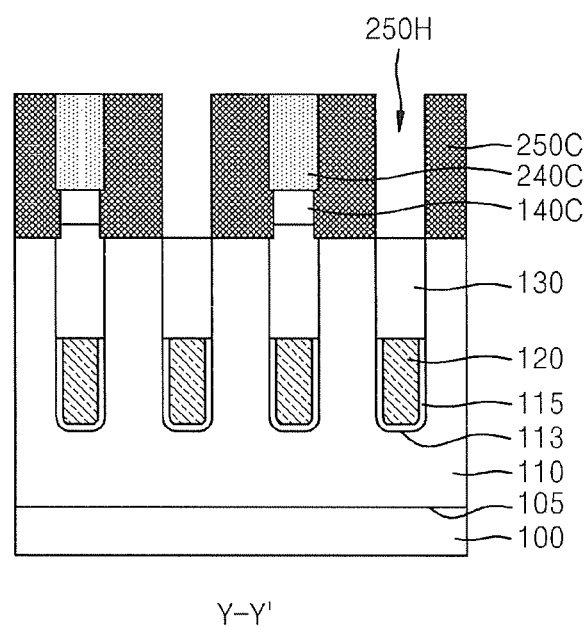

Referring to FIGS. 31A through 31C, an etching operation is performed to divide the conductive pattern 250 for forming a buried contact, which is formed in the plurality of spaces 240H (see FIG. 30A), into two spaces, to thereby form space 250H in which a contact separating insulation layer 260C (see FIGS. 32A through 32C) is to be formed.

Figure 32A:
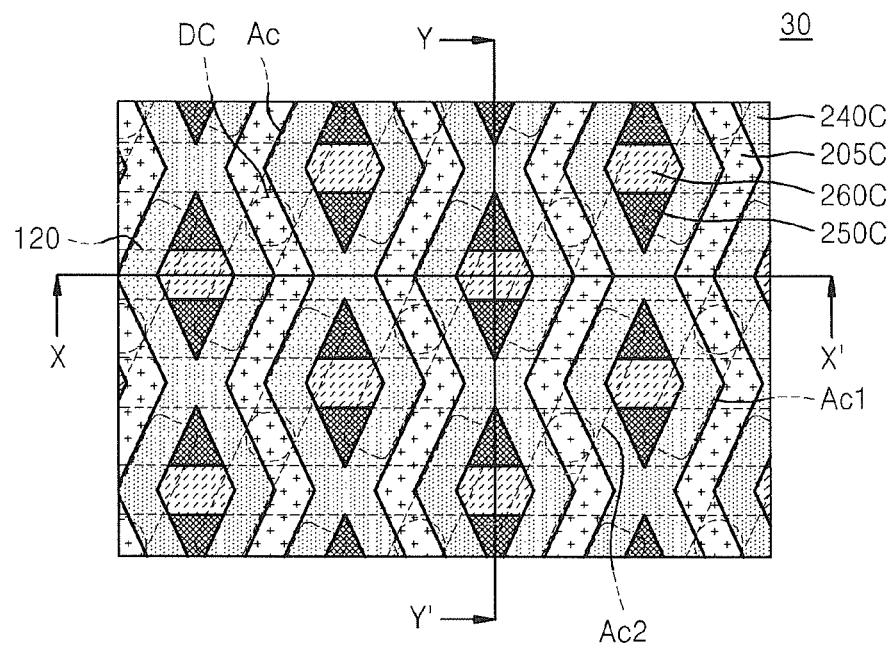
Figure 32B:
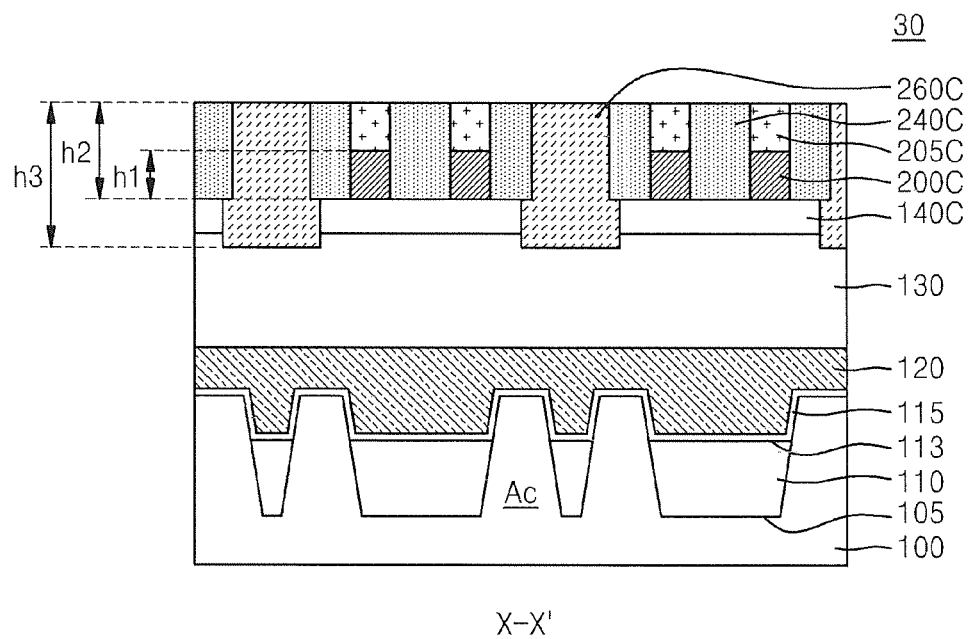
Figure 32C:
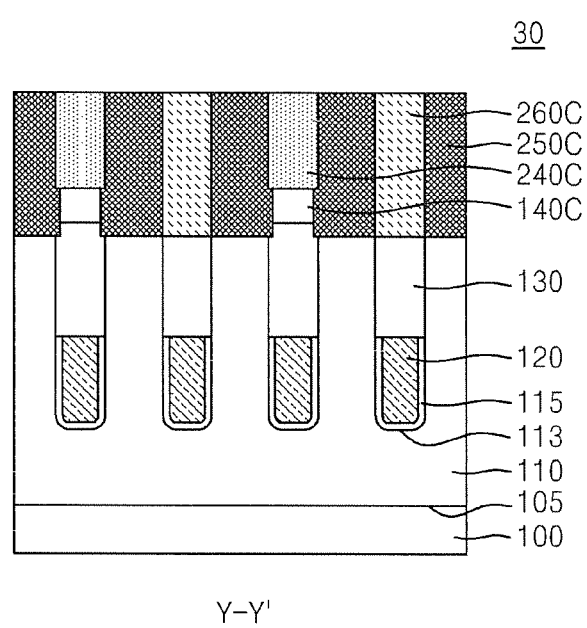

Referring to FIGS. 32A through 32C, a contact separating insulation layer 260C is filled the space 250H (see FIGS. 31A through 31C), in which the contact separating insulation layer 260C is to be formed. After forming an insulation layer that fills the space 250H in which the contact separating insulation layer 260C is to be formed, the insulation layer is etched by using an etchback operation or a CMP operation to expose an upper surface of a buried contact 250C, and the contact separating insulation layer 260C may be left in the space 250H. The contact separating insulation layer 260C may be formed at a position where it is overlapped with the plurality of word lines 120. A distance h1 between a bottom surface and an upper surface of the bit line 200C may be smaller than a distance h2 between a bottom surface and an upper surface of the integral spacer 240C. A distance h3 between a bottom surface and an upper surface of the contact separating insulation layer 260C may be greater than the distance h2 between the bottom surface and the upper surface of the integral spacer 240C.

Through the above operation, two conductive patterns respectively abutting on the two active areas Ac1 and Ac2, that is, the buried contacts 250C may be formed in the plurality of spaces 240H formed in the spacer 240C. FIG. 32A schematically illustrates two adjacent active areas Ac1 and Ac2 in one of the plurality of spaces 240H (see FIGS. 31A through 31C) in the integral spacer 240C that is selected, and two buried contacts 250C that respectively contact the two adjacent active areas Ac1 and Ac2.

After performing the operations of FIGS. 24A through 32C, the same or similar operations as those discussed above with respect to FIGS. 13A through 14C are performed to form a landing pad 300 and a capacitor bottom electrode 310.

Unlike a manufacturing process of a typical semiconductor device which has a linear bit line structure, processing steps in the fabrication of the semiconductor device in accordance with embodiments of the inventive concept has a nonlinear bit line structure and a plurality of spaces between spacers that are formed by adjusting a thickness of the spacers, and a buried contact BC may be formed by self-alignment without an exposure operation. Accordingly, using methods in accordance with embodiments discussed herein, the semiconductor manufacturing costs may be reduced by reducing the number of times of an exposure operation to be performed in a semiconductor device that has a minute unit cell size due to integration, and a contact area between an active area and a contact may be secured by a simple manufacturing process.

Figure 33:
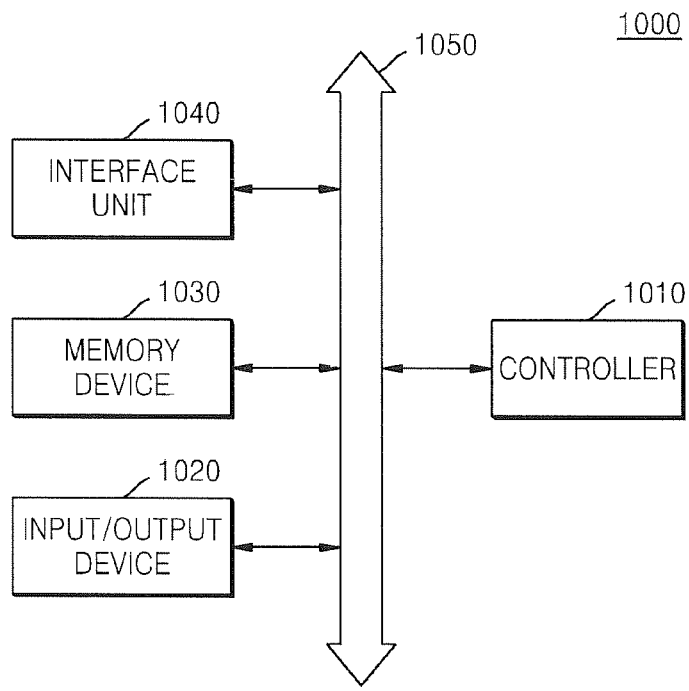
FIG. 33 is a block diagram of a system including a semiconductor device according to some embodiments of the present inventive concept.
Figure 34:
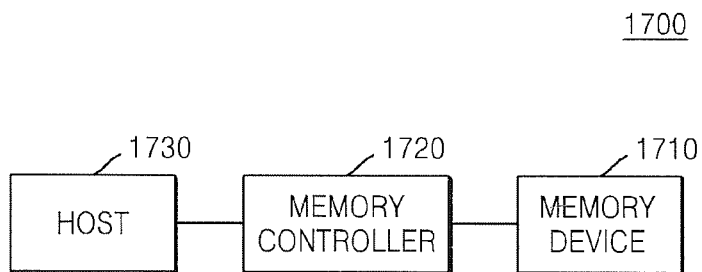
FIG. 34 is a block diagram of a memory card including a semiconductor device according to some embodiments of the present inventive concept.

Referring now to FIG. 33, a block diagram illustrating a system 1000 including a semiconductor device according to some embodiments of the present inventive concept will be discussed. The system 1000 may include a controller 1010, an input and output device 1020, a memory device 1030, and an interface 1040. The system 1000 may be a mobile system or a system that transmits or receives information. In some embodiments, the mobile system may be, for example, a personal digital assistant (PDA), a portable computer, a web tablet, a wireless phone, a mobile phone, a digital music player, or a memory card. The controller 1010 is used to control an execution program in the system 1000 and may be formed of a microprocessor, a digital signal processor, a microcontroller, or a similar device. The input and output device 1020 may be used to input or output data of the system 1000. The system 1000 may be connected to an external device such as a personal computer or a network, by using the input and output device 1020, and may exchange data with the external device. The input and output device 1020 may be, for example, a keypad, a keyboard, or a display.

The memory device 1030 may store codes and/or data for an operation of the controller 1010 or may store data processed by the controller 1010. The memory device 1030 includes a semiconductor device including a fin-type field effect transistor according to the inventive concept. For example, the memory device 1030 may include at least one semiconductor device from among the semiconductor devices 10, 20, and 30 illustrated in FIGS. 1A through 32C.

The interface 1040 may be a data transmission path between the system 1000 and another external device. The controller 1010, the input and output device 1020, the memory device 1030, and the interface 1040 may communicate with one another via a bus 1050. The system 1000 may be used in a mobile phone, a MP3 player, a navigation device, a portable multimedia player (PMP), a solid state disk (SSD), or household appliances.

Referring now to FIG. 3, a memory card 1100 including a semiconductor device according to some embodiments of the inventive concept will be discussed. As illustrated, therein, the memory card 1100 includes a memory device 1110 and a memory controller 1120.

The memory device 1110 may store data. In some embodiments, the memory device 1110 may be nonvolatile so that data stored therein may be maintained even if a power supply is stopped. The memory device 1110 may include at least one semiconductor device from among the semiconductor devices 10, 20, and 30 illustrated in FIGS. 1A through 32C.

The memory controller 1120 may read data stored in the memory device 1110 in response to a read or write request of a host 1130 or may store data of the memory device 1110. The memory controller 1120 may include at least one semiconductor device from among the semiconductor devices 10, 20, and 30 illustrated in FIGS. 1A through 32C.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
a substrate including a field area delimiting an active area;
a word line crossing the active area; and
a bit line having a wave shape and including a first bending portion, a second bending portion, and a third bending portion between the first bending portion and the second bending portion, the third bending portion crossing the active area, the first bending portion and the second bending portion on the field area, the first bending portion and the second bending portion opposite with respect to the active area,
wherein the first bending portion includes a highest point of the wave shape and the second bending portion includes a lowest point of the wave shape.

2. The semiconductor device of claim 1, wherein the first bending portion and the second bending portion are diagonally opposite with respect to the active area.

3. The semiconductor device of claim 2, wherein the first bending portion and the second bending portion are parallel with respect to the active area.

4. The semiconductor device of claim 1, further comprising another active area, wherein a first conductive pattern is on or near an end of the active area, and a second conductive pattern is on or near an end of the other active area.

5. The semiconductor device of claim 4, further comprising a contact separating insulation layer between the first conductive pattern and the second conductive pattern.

6. The semiconductor device of claim 5, further comprising another bit line, wherein a first bit line spacer on the bit line and a second bit line spacer on the other bit line.

7. The semiconductor device of claim 6, wherein the first conductive pattern and the second conductive pattern are between the first bit line spacer and the second bit line spacer.

8. The semiconductor device of claim 1, wherein the highest point of the wave shape and the lowest point of the wave shape are on the field area.

9. The semiconductor device of claim 1, further comprising a direct contact disposed between the active area and the third bending portion.

\* \* \* \* \*